United States Patent
Helander et al.

(10) Patent No.: US 10,355,246 B2
(45) Date of Patent: Jul. 16, 2019

(54) BARRIER COATING FOR OPTO-ELECTRONICS DEVICES

(71) Applicant: OTI Lumionics Inc., Toronto, Ontario (CA)

(72) Inventors: Michael Helander, Toronto (CA); Zhibin Wang, Toronto (CA); Jacky Qiu, Toronto (CA); Yi-Lu Chang, Scarborough (CA); Qi Wang, North York (CA)

(73) Assignee: OTI Lumionics Inc., Toronto, Ontario (*) Notice: Subject to any disclaimer, the term of this patent is extended or adjusted under 35 U.S.C. 154(b) by 0 days.

(21) Appl. No.: 15/781,588

(22) PCT Filed: Dec. 16, 2016

(86) PCT No.: PCT/CA2016/051502
§ 371 (c)(1),
(2) Date: Jun. 5, 2018

(87) PCT Pub. No.: WO2017/100944
PCT Pub. Date: Jun. 22, 2017

(65) Prior Publication Data
US 2019/0044089 A1    Feb. 7, 2019

Related U.S. Application Data

(60) Provisional application No. 62/268,242, filed on Dec. 16, 2015.

(51) Int. Cl.
*H01L 51/52* (2006.01)
*H01L 51/00* (2006.01)
*B82Y 20/00* (2011.01)

(52) U.S. Cl.
CPC ............ *H01L 51/529* (2013.01); *H01L 51/00* (2013.01); *H01L 51/0046* (2013.01);
(Continued)

(58) Field of Classification Search
CPC ............... H01L 51/529; H01L 51/5256; H01L 51/0046; H01L 51/0048; H01L 51/52; H01L 51/00; B82Y 20/00
See application file for complete search history.

(56) References Cited

U.S. PATENT DOCUMENTS

| 4,885,211 A | 12/1989 | Tang et al. |
| 5,059,862 A | 10/1991 | VanSlyke et al. |

(Continued)

FOREIGN PATENT DOCUMENTS

| CA | 2450611 A1 | 2/2004 |
| CA | 2552488 A1 | 9/2005 |

(Continued)

OTHER PUBLICATIONS

"International Application No. PCT/CA2016/051502, International Search Report dated Mar. 16, 2017", (Mar. 16, 2017), 3 pgs.

(Continued)

*Primary Examiner* — Thanh T Nguyen
(74) *Attorney, Agent, or Firm* — Schwegman Lundberg & Woessner, P.A.

(57) ABSTRACT

The following relates to barrier coating for organic opto-electronic devices. In particular, the following relates a barrier coating comprising and methods and processes for depositing a barrier coating on a surface.

18 Claims, 32 Drawing Sheets

(52) U.S. Cl.
CPC ...... *H01L 51/0048* (2013.01); *H01L 51/5256* (2013.01); *B82Y 20/00* (2013.01)

(56) References Cited

U.S. PATENT DOCUMENTS

| | | | |
|---|---|---|---|
| 6,794,061 | B2 | 9/2004 | Liao et al. |
| 7,009,338 | B2 | 3/2006 | D'Andrade et al. |
| 7,285,907 | B2 | 10/2007 | D'Andrade et al. |
| 8,040,053 | B2 | 10/2011 | D'Andrade et al. |
| 8,105,701 | B2 | 1/2012 | Matsuura et al. |
| 8,445,895 | B2 | 5/2013 | Okumoto et al. |
| 8,658,442 | B2 * | 2/2014 | Schmid ............... C23C 16/0272 438/26 |
| 8,659,010 | B2 | 2/2014 | Song et al. |
| 8,729,528 | B2 | 5/2014 | Klem |
| 8,994,010 | B2 | 3/2015 | Choi et al. |
| 9,088,004 | B2 | 7/2015 | Chung |
| 9,287,338 | B2 | 3/2016 | So et al. |
| 9,315,387 | B2 | 4/2016 | Shin et al. |
| 2004/0048033 | A1 | 3/2004 | Klausmann et al. |
| 2004/0214041 | A1 | 10/2004 | Lu et al. |
| 2005/0062406 | A1 | 3/2005 | Kinoshita |
| 2005/0288236 | A1 | 12/2005 | Lebovitz et al. |
| 2006/0006796 | A1 | 1/2006 | Lee et al. |
| 2006/0011927 | A1 | 1/2006 | Ko |
| 2006/0202614 | A1 | 9/2006 | Li |
| 2006/0228543 | A1 | 10/2006 | Lu et al. |
| 2006/0251924 | A1 | 11/2006 | Lu et al. |
| 2008/0258612 | A1 | 10/2008 | Kim et al. |
| 2009/0011278 | A1 | 1/2009 | Choi et al. |
| 2009/0050206 | A1 | 2/2009 | Halls et al. |
| 2009/0066223 | A1 | 3/2009 | Yabe et al. |
| 2009/0151787 | A1 | 6/2009 | Yoshikawa et al. |
| 2009/0166512 | A1 | 7/2009 | Fürst et al. |
| 2009/0199903 | A1 | 8/2009 | Oyamada et al. |
| 2012/0016074 | A1 | 1/2012 | Elizalde et al. |
| 2012/0211078 | A1 * | 8/2012 | Kato ............... B82Y 10/00 136/257 |
| 2012/0216867 | A1 | 8/2012 | Ito et al. |
| 2012/0280217 | A1 | 11/2012 | Matsuura et al. |
| 2012/0313099 | A1 | 12/2012 | Chung et al. |
| 2013/0000952 | A1 | 1/2013 | Srinivas et al. |
| 2013/0074920 | A1 | 3/2013 | Echegoyen et al. |
| 2014/0110691 | A1 * | 4/2014 | Lin ............... C07F 15/0033 257/40 |
| 2014/0186983 | A1 | 7/2014 | Kim et al. |
| 2015/0060778 | A1 * | 3/2015 | Kim ............... H01L 27/3258 257/40 |
| 2015/0076469 | A1 * | 3/2015 | Ikemizu ............... C09K 11/88 257/40 |
| 2015/0287846 | A1 | 10/2015 | Helander et al. |

FOREIGN PATENT DOCUMENTS

| | | |
|---|---|---|
| CN | 1170383 A | 1/1998 |
| CN | 1596048 A | 3/2005 |
| CN | 102315390 A | 1/2012 |
| EP | 2012375 A2 | 1/2009 |
| JP | 07224012 A | 8/1995 |
| JP | 2002249765 A | 9/2002 |
| JP | 2004327436 A | 11/2004 |
| JP | 2004335610 A | 11/2004 |
| JP | 2007005047 A | 1/2007 |
| JP | 2008541356 A | 11/2008 |
| JP | 2009016332 A | 1/2009 |
| JP | 2010219447 A | 9/2010 |
| JP | 2011181413 A | 9/2011 |
| JP | 2012160702 A | 8/2012 |
| TW | 201237197 A | 9/2012 |
| WO | WO-2004097954 A1 | 11/2004 |
| WO | WO-2006121872 A2 | 11/2006 |
| WO | WO-2012016074 A1 | 2/2012 |
| WO | WO-2014071518 A1 | 5/2014 |

OTHER PUBLICATIONS

"International Application No. PCT/CA2016/051502, Written Opinion dated Mar. 16, 2017", (Mar. 16, 2017), 4 pgs.
"Chinese Application Serial No. 201380058142.7, Chinese Search Office dated May 8, 2017", w/English Translation, 24 pgs.
"European Application Serial No. 13853612, Extended European Search Report dated May 27, 2016", 3 pgs.
"International Application Serial No. PCT/CA2013/050848, International Search Report dated Mar. 3, 2014", 4 pgs.
"International Application Serial No. PCT/CA2013/050848, Written Opinion dated Jul. 13, 2005", 7 pgs.
"International Application Serial No. PCT/CA2016/051502, International Search Report dated May 1, 2017", 3 pgs.
"Japanese Application Serial No. 2015-540005, Office Action dated Jul. 3, 2018", 4 pgs.
"Japanese Application Serial No. 2015-540005, Office Action dated Jul. 11, 2017", 11 pgs.
Chen, Y., et al., "Fullerides of alkaline-earth metals", Phys. Rev. B, 45(15), (1992), 8845-8848.
Cheng, Gang, et al., "White organic light-emitting devices with a phosphorescent multiple emissive layer", Applied Physics Letters 89, 043504, (2006), 331-336.
Chikamatsu, Masayuki, et al., "C60 thin-film transistors with low work-function metal electrodes", Applied physics letters 85.12, (2004), 2396-2398.
D'Andrade, Brian W., et al., "Controlling Exciton Diffusion in Multilayer White Phosphorescent Organic Light Emitting Devices", Advanced Materials,14(2), (2002), 147-151.
D'Andrade, Brian W., et al., "Efficient Organic Electrophosphorescent White-Light-Emitting Device with a Triple Doped Emissive Layer", Advanced Materials, 16(7), (2004), 624-628.
Reineke, Sebastian, et al., "White organic light-emitting diodes with fluorescent tube efficiency", Nature, vol. 459, (2009), 234-238.
Srivastava, Ritu, et al., "Fabrication of white organic light-emitting diodes by co-doping of emissive layer", Indian Journal of Pure & Applied Physics, vol. 47, (2009), 19-23.
Sun, Yiru, et al., "Management of singlet and triplet excitons for efficient white organic light-emitting devices", Nature, vol. 440, (2006), 908-912.
Taima, Tetsuya, et al., "Insertion of thin interlayers under the negative electrode of C60 Schottky-type photovoltaic cells", The Journal of Physical Chemistry B 108.1, (2004), 1-3.
Tokito, Shizuo, et al., "High-efficiency blue and white phosphorescent organic light-emitting devices", Current Applied Physics, 5(4), (2005), 331-336.
Tsujioka, Tsuyoshi, et al., "Selective Metal Deposition on Photoswitchable Molecular Surfaces", J. Am. Chem Soc., 130(32), (2008), 10740-10747.
Wang, et al., "Manipulating Charges and Excitons within a Single-Host System to Accomplish Efficiency/CRI/Color-Stability Trade-off for High-Performance OWLEDs", Advanced Materials, 21, (2009), 2397-2401.
Wang, Qi, et al., "Manipulating Charges and Excitons within Single-Host System to Accomplish Efficiency/CRI/Color-Stability Trade-off for High Perfromance OWLEDs", Supporting Information, (2008), 8 pgs.
"U.S. Appl. No. 14/440,797, Final Office Action dated Jul. 31, 2017", 12 pgs.
"U.S. Appl. No. 14/440,797, Final Office Action dated Nov. 1, 2018", 15 pgs.
"U.S. Appl. No. 14/440,797, Non Final Office Action dated Dec. 6, 2017", 13 pgs.
"U.S. Appl. No. 14/440,797, Non Final Office Action dated Dec. 16, 2016", 9 pgs.
"U.S. Appl. No. 14/440,797, Preliminary Amendment filed May 5, 2015", 7 pgs.
"U.S. Appl. No. 14/440,797, Response filed Apr. 14, 2017 to Non Final Office Action dated Dec. 16, 2016", 8 pgs.
"U.S. Appl. No. 14/440,797, Response filed Jun. 6, 2018 to Non Final Office Action dated Dec. 6, 2017", 11 pgs.
"U.S. Appl. No. 14/440,797, Response filed Sep. 7, 2016 to Restriction Requirement dated Jul. 13, 2016", 6 pgs.

(56) References Cited

OTHER PUBLICATIONS

"U.S. Appl. No. 14/440,797, Response filed Sep. 18, 2017 to Final Office Action dated Jul. 31, 2017", 10 pgs.
"U.S. Appl. No. 14/440,797, Restriction Requirement dated Jul. 13, 2016", 10 pgs.
"Chinese Application No. 201380058142.7, Office Action dated May 8, 2017", w/ English Translation, (May 8, 2017), 22 pgs.
"Chinese Application No. 201380058142.7, Search Report dated Aug. 15, 2016", w/ English Translation, (Aug. 15, 2016), 4 pgs.
"European Application Serial No. 13853612, Supplemental European Search Report dated May 27, 2016", 3 pgs.
"International Application Serial No. PCT/CA2013/050848, Written Opinion dated Mar. 3, 2014", 7 pgs.
"Japanese Application No. 2015-540005, Office Action dated Jul. 11, 2017", w/ English Translation, (Jul. 11, 2017), 11 pgs.
"Japanese Application Serial No. 2015-540005, Office Action dated Jul. 3, 2018", w/ English Summary, (Jul. 3, 2018), 4 pgs.

\* cited by examiner

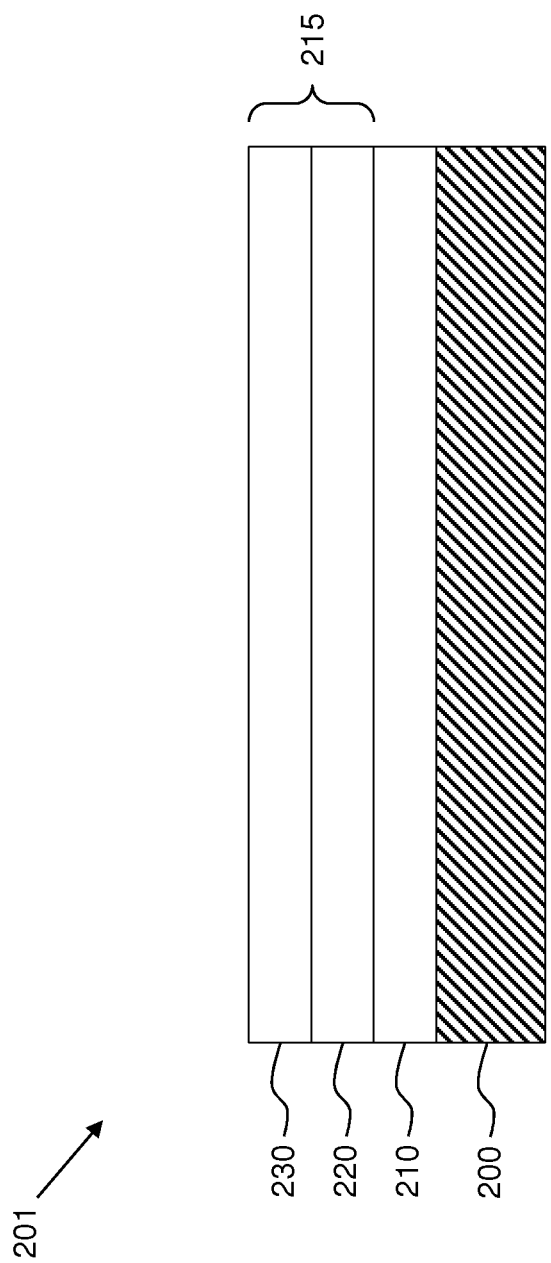

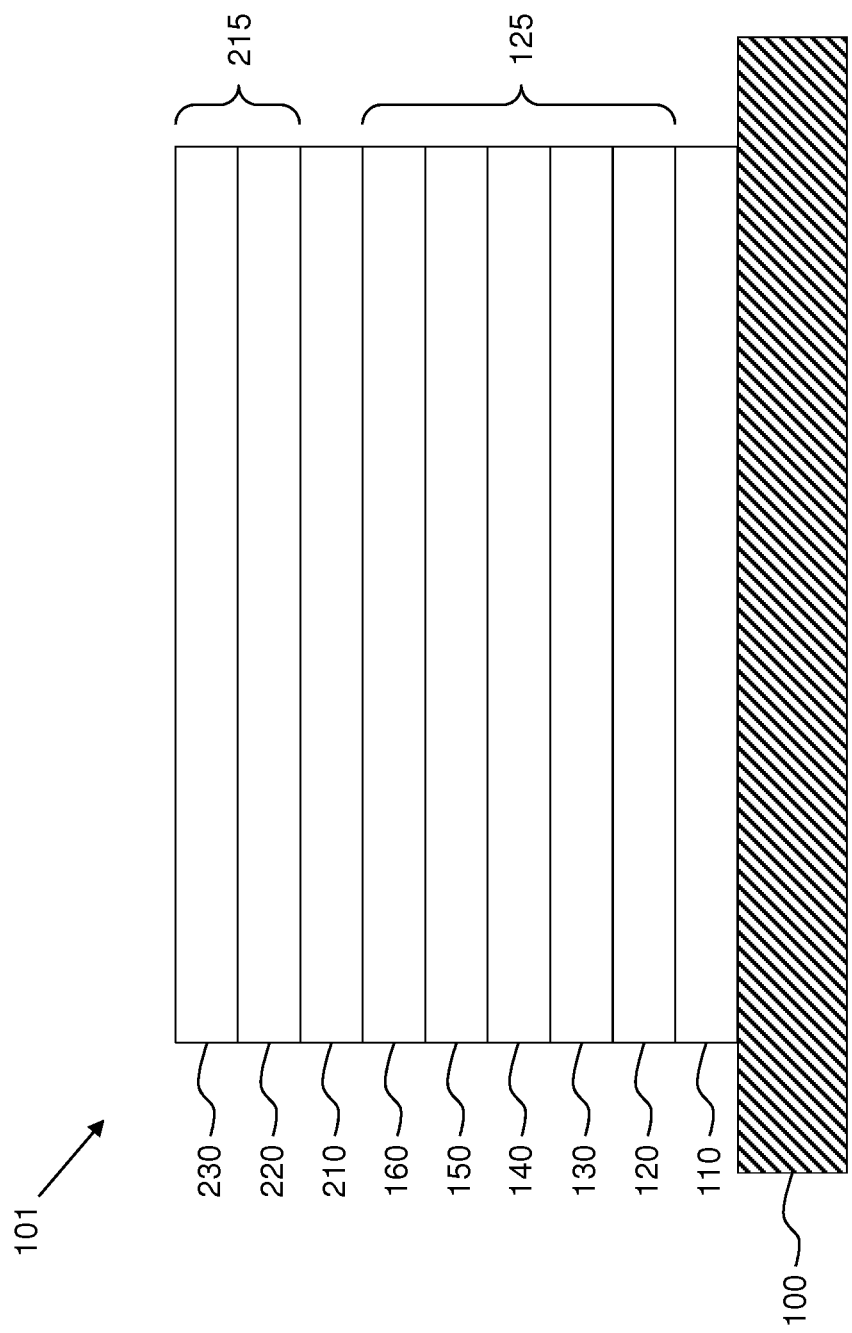

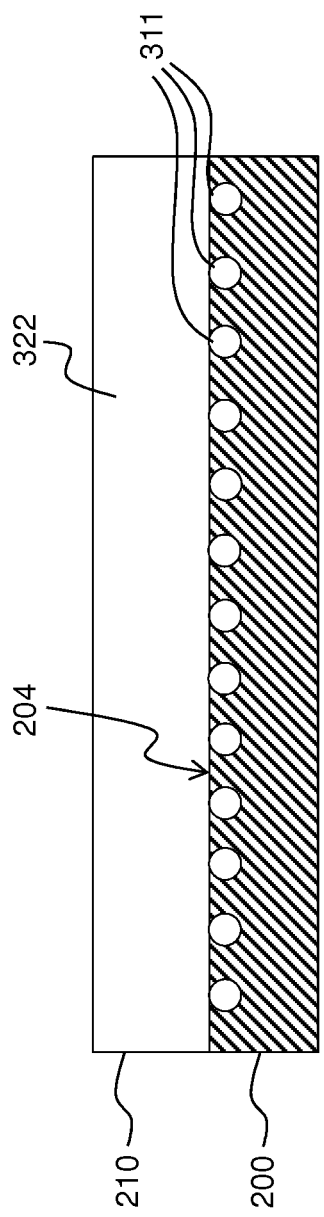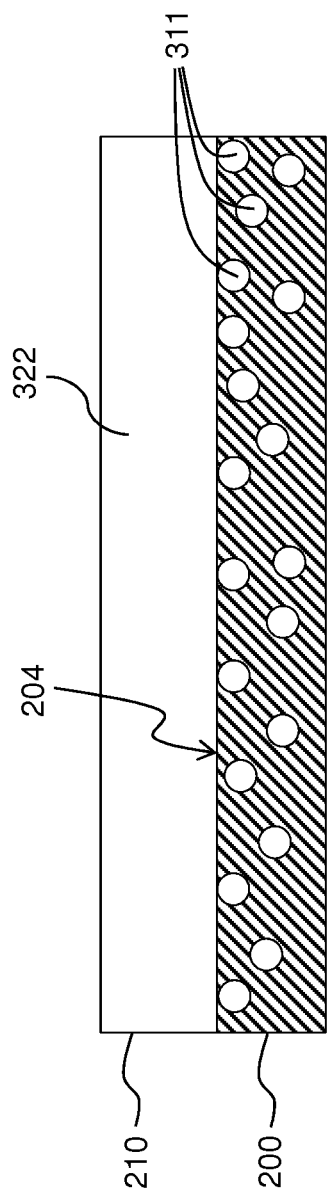

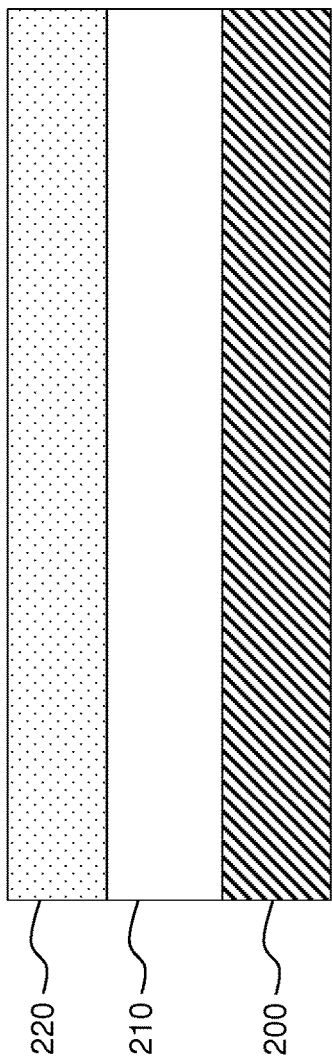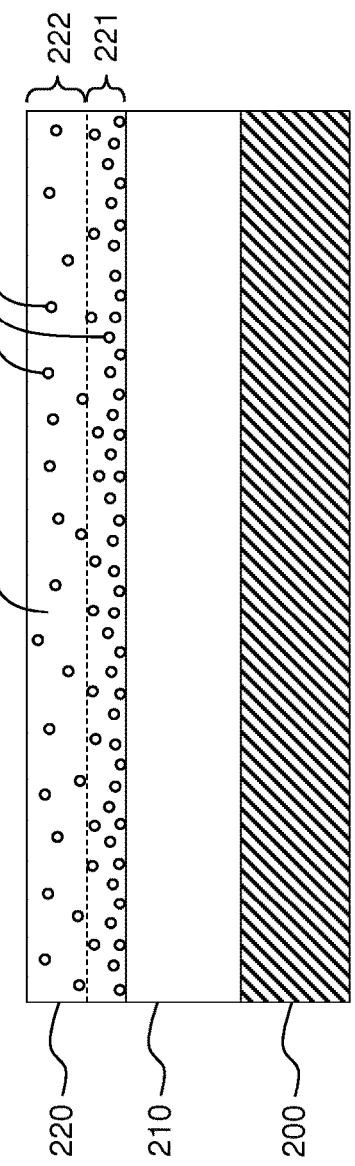
FIG. 6A
FIG. 6B

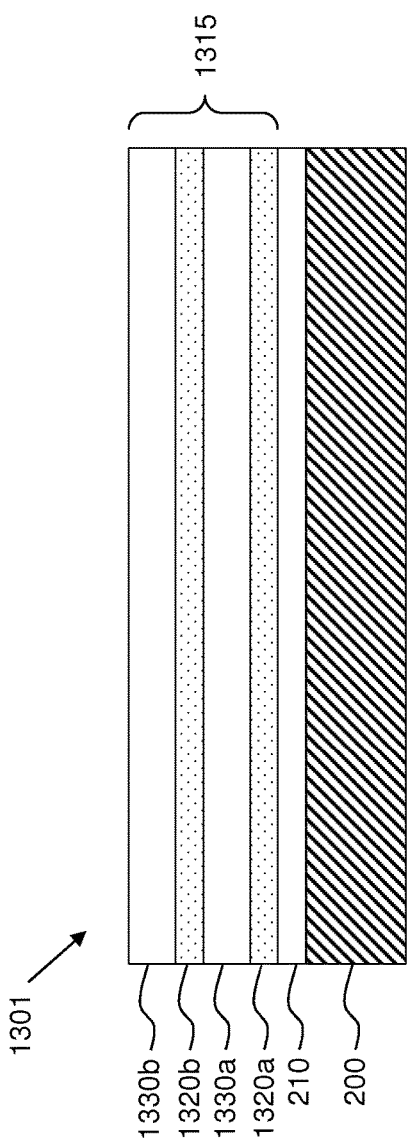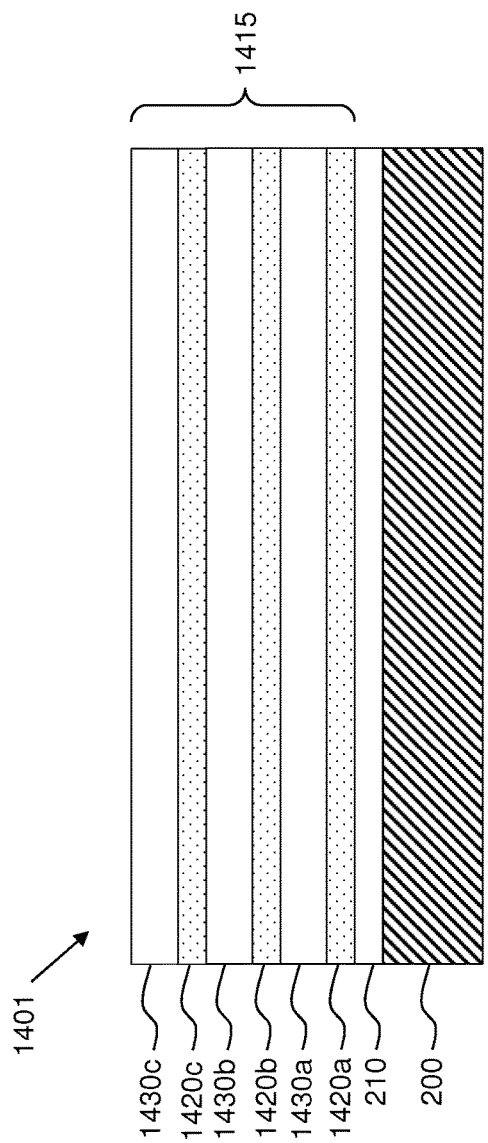

BARRIER COATING FOR OPTO-ELECTRONICS DEVICES

PRIORITY APPLICATIONS

This application is a U.S. National Stage Filing under 35 U.S.C. 371 from International Application No. PCT/CA2016/051502, filed on Dec. 16, 2016, and published as WO2017/100944 on Jun. 22, 2017, which claims the benefit of priority to U.S. Provisional Application No. 62/268,242, filed on Dec. 16, 2015; the benefit of priority of each of which is hereby claimed herein, and which applications and publication are hereby incorporated herein by reference in their entirety.

TECHNICAL FIELD

The following relates to barrier coating for organic opto-electronic devices and method therefor. In particular, the following relates a barrier coating and methods and processes for depositing a barrier coating on a surface.

BACKGROUND

Organic light emitting diodes (OLEDs) typically include several layers of organic materials interposed between conductive thin film electrodes, with at least one of the organic layers being an electroluminescent layer. When a voltage is applied to electrodes, holes and electrons are injected by an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. For example, in a bottom-emission device, an electrode that is proximal to the base substrate is generally made to be light transmissive (e.g., substantially transparent or semi-transparent), and an electrode that is distal to the base substrate is generally made to be reflective.

Depending on the specific device structure, either an anode or a cathode may act as a reflective electrode in a bottom-emission device. In a typical bottom-emission device, however, the reflective electrode is generally chosen to be the cathode. Materials which are typically used to form the reflective cathode include metals such as aluminum (Al), silver (Ag), and various metallic alloys.

Since various portions of the OLED devices are easily degraded when exposed to reactive materials such as oxygen and moisture which are present in the air, they are typically encapsulated to inhibit such reactive materials from contacting the device. For example, OLED devices may be encapsulated using thin-film encapsulation (TFE), a combination of a barrier film and barrier adhesive, or combination thereof.

However, encapsulation of OLED devices remains a challenge for a number of reasons, such as due to the relatively high permeability of the materials used for encapsulation, and/or difficulties associated with forming and maintaining a hermetic seal between the encapsulant and the surface of the OLED device. Particularly with respect to flexible OLED devices, many encapsulant or barrier solutions do not possess suitable mechanical properties for allowing the encapsulated OLED device to remain flexible while providing sufficient barrier properties. For example, some encapsulants contain brittle and/or inelastic materials which break or deform when bent, thus rendering the OLED device unusable. Some materials used to form barrier layers and barrier adhesives are also known to exhibit relatively high water vapor transmission rate (WVTR), and thus may be undesirable for use in devices which require high environmental stability. While barrier films exhibiting relatively low WVTR of less than $10^{-6}$ g/m$^2$·day also exist, such films are generally expensive.

In addition to the above, a number of OLED encapsulation solutions or processes require additional equipment, such as deposition chamber(s), coaters and/or laminators for performing the encapsulation of the device. Moreover, such processes typically require an unencapsulated OLED device to be transferred to the encapsulation equipment, subsequent to the deposition of the top electrode (e.g. a cathode) for completing the fabrication of the OLED device. In some cases, the unencapsulated OLED device may become exposed to air or other reactive gases during the transfer or during the encapsulation stage, which can lead to degradation and/or contamination of the device even before the device has been encapsulated.

SUMMARY

In one aspect of the invention there is provided an opto-electronic device comprising a first electrode; a second electrode; an organic layer disposed between the first electrode and the second electrode; and a barrier coating disposed over the second electrode, the barrier coating comprising: two or more first portions arranged in layers, each of the first portions comprising fullerene; and one or more second portions, wherein the second portions are arranged in layers alternating with the two or more first portions, the second portion comprising a metal.

In another aspect of the average density of the first portions of the barrier coating are greater than the average density of the second portion.

In yet another aspect the compactness of each of the first portions of the barrier coating are greater than the compactness of the second portion.

In still a further aspect the average grain size of each of the first portions of the barrier coating is less than the average grain size of the second portion.

In one embodiment, the first portions and the second portion of the barrier coating are formed integrally with one another.

In another embodiment the fullerene comprises at least one of $C_{60}$, $C_{70}$, $C_{76}$, $C_{84}$, single-wall carbon nanotubes, and multi-wall carbon nanotubes.

BRIEF DESCRIPTION OF THE DRAWINGS

Embodiments will now be described by way of example only with reference to the appended drawings wherein:

FIG. 1 is a diagram illustrating a portion of a barrier coating disposed on a substrate according to one embodiment;

FIG. 2 is a diagram illustrating an opto-electronic device including a barrier coating according to one embodiment;

FIG. 3A-3H are diagrams illustrating an electrode disposed beneath the barrier coating according to various embodiments;

FIG. 6A-6D are diagrams illustrating a first portion of a barrier coating according to various embodiments;

FIG. 13 is a diagram of an opto-electronic device including a barrier coating having a plurality of barrier coating portions according to one embodiment;

FIG. 14 is a diagram of an opto-electronic device including a barrier coating having a plurality of barrier coating portions according to another embodiment;

DETAILED DESCRIPTION

Figure 3A:
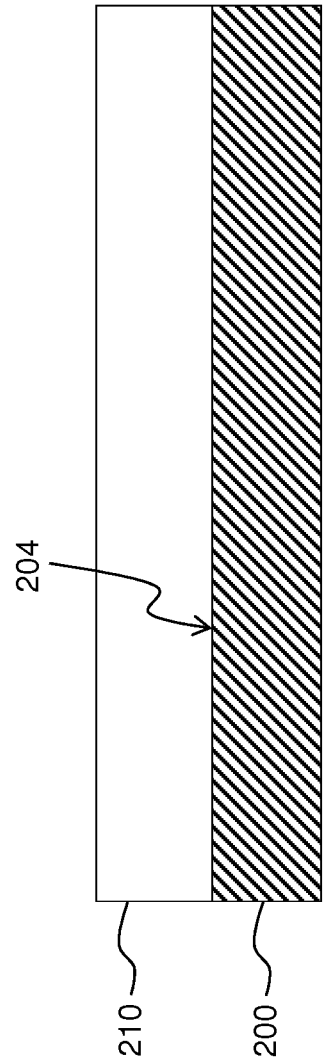

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practised without these specific details. In other instances, well-known methods, procedures and components have not been described in detail so as not to obscure the example embodiments described herein.

In one aspect, an opto-electronic device is provided. The opto-electronic device comprises a coating for inhibiting the passage of moisture and/or gases (e.g. air and oxygen) therethrough. In various aspects and embodiments, such coating may be referred to herein as a barrier coating. The barrier coating may be disposed over an electrode, for example a cathode, of the opto-electronic device. The barrier coating includes a first portion and a second portion. The first portion comprises a fullerene and the second portion comprises a metal. In some cases, the second portion may comprise a mixture of the metal and fullerene.

As used herein, the term "barrier coating" will be understood to refer to a coating which generally inhibits the passage of reactive materials, such as oxygen, water and/or other gases therethrough. The passage of reactive materials through the barrier coating may be inhibited by any number of mechanisms. Example of such mechanisms include, for example, tortuous path created within the barrier coating resulting in a relatively low permeability, and reaction or absorption of the reactive material by portion(s) of the barrier coating acting as a getterer and/or desiccant.

As used herein, the term "formed integrally" would generally be understood mean that portions of a coating are formed as a single continuous structure as opposed to discrete layers or coatings. In some cases this may include intermingling of the material of one portion with the material of the adjacent portion at the interface between the layers, such that the layers of the different portions are not discreet and have a continuous structure. In some cases a gradient may exist as one portion extends into the next portion such that individual layers do not exhibit a marked beginning or end.

FIG. 1 illustrates an opto-electronic device 201 according to one embodiment, wherein a barrier coating 215 is disposed over an electrode 210 formed on a substrate 200. In the illustrated embodiment, the barrier coating 215 comprises a first portion 220 and a second portion 230 disposed over the first portion 220.

In some embodiments, the electrode 210 comprises a metal. For example, the metal may be a metallic element such as, for example, an alkali metal, an alkaline earth metal, a lanthanide, a transition metal, post-transition metal, or any combination thereof. The metal may be an alloy. For example, the electrode 210 may comprise magnesium (Mg), zinc (Zn), aluminum (Al), ytterbium (Yb), silver (Ag), or any combination thereof including alloys. For example, the alloy may be a Mg:Ag alloy having a composition range of between about 1:10 and 10:1 by volume or by atomic composition ratio, or a Mg:Yb alloy having a composition range of between about 1:10 and 10:1 by volume or by atomic composition ratio. In other embodiments, the electrode 210 may comprise other conductive materials. Examples of such materials include, for example, conductive polymers, nanowires, graphene, carbon nanotubes, and oxides such as indium tin oxide (ITO).

The electrode 210 may, for example, be a cathode of the opto-electronic device 201. Accordingly, the electrode 210 is electrically conductive.

The first portion 220 of the barrier coating 215 may comprise fullerene. In some embodiments, the first portion 220 may comprise a mixture of a metal and fullerene. For example, the metal may be magnesium (Mg), zinc (Zn), cadmium (Cd), or any combination thereof. Fullerene may comprise $C_{60}$, $C_{70}$, $C_{76}$, $C_{84}$, single-wall carbon nanotubes, multi-wall carbon nanotubes, and any combination thereof. The first portion 220 may comprise a mixture of a metal and fullerene, wherein the metal comprises the majority of the first portion 220. In other words, the metal constitutes greater than about 50% by volume of the mixture. In some embodiments, the metal may constitute greater than about 60%, greater than about 70%, greater than about 75%, greater than about 80%, greater than about 85%, greater than about 90%, or greater than about 95% of the mixture. In particular, as will be explained further below, it has now been found that at least in some embodiments, it may be particularly advantageous to provide a first portion 220 comprising a mixture of a metal and fullerene, wherein fullerene constitutes between about 1 to 25 percent by volume, between about 1 to 20 percent by volume, between about 1 to 15 percent by volume, between about 2 to 15 percent by volume, between about 5 to 15 percent by volume, or between about 5 to 10 percent by volume of the mixture. For example, fullerene may constitute less than 1 mole percent, less than 0.8 mole percent, less than 0.6 mole percent, less than 0.5 mole percent, less than 0.3 mole percent, less than 0.1 mole percent, or less than 0.08 mole percent of the mixture. The metal may constitute the remainder of the mixture. In some embodiments, the metal may be pure or substantially pure magnesium and fullerene may be buckminsterfullerene ($C_{60}$).

In some embodiments, the first portion 220 may consist essentially of fullerene. In other words, in such embodiments, the first portion 220 may contain fullerene and small or trace amounts of other materials, the presence of which do not materially affect the mechanical, electrical, and/or optical characteristics of the first portion 220 formed substantially by fullerene. For example, small or trace amounts of other materials include impurities which may be present in fullerene or in the reaction chamber. For example, the concentration of such materials in the first portion 220 may be less than about 0.1% by volume, less than about 0.05% by volume, less than about 0.01% by volume, less than about 0.001% by volume, or less than about 0.0001% by volume.

As used herein, the term crystalline would be understood to mean that the material generally exhibits a long-range order or structure. For example, the crystallinity of a crystalline material may be greater than about 50%, greater than about 60%, greater than about 70%, greater than about 75%, greater than about 80%, greater than about 85%, greater than about 90%, or greater than about 95%. The crystallinity of a material may be determined using various techniques such as, for example, x-ray crystallography and differential scanning calorimetry (DSC).

The second portion 230 may comprise a metal. For example, the metal may be magnesium (Mg), zinc (Zn), cadmium (Cd), or any combination thereof. In some embodiments, the metal used in the second portion 230 may be the same as the metal used in the first portion 220.

The second portion 230 may comprise a getterer and/or a hygroscopic material (i.e. a desiccant). For example, the second portion 230 may comprise pure or substantially pure magnesium, which is both a getterer and a desiccant. As will be understood by persons skilled in the art, a getterer is generally a material provided on a product or device for purposes of improving the "shelf-life" of the product or device. Getterers generally remove, passivate, contain, or otherwise inhibit unfavorable species from negatively affecting device performance. According to one embodiment, the second portion 230 is formed integral with the first portion 220 by depositing a relatively thick coating comprising magnesium over the first portion 220. The getterer may react with, or otherwise passivate, oxygen and/or water vapor present in the device packaging environment to produce magnesium oxide and/or hydroxide and thereby remove these molecules from the device packaging environment. The portion of the coating acting as the getterer may have a reduced, or zero, concentration of fullerene. Providing a getterer in OLED devices may be particularly beneficial, as OLED devices containing emitting layers which may be quenched in the presence of oxygen. By providing a getterer, the concentration of oxygen within a packaged environment for the OLED device may comparatively reduced, thus slowing the degradation of the emitting layer.

In some embodiments, the electrode 210 may further comprise fullerene. Specifically, the electrode 210 may comprise a mixture of fullerene and a metal. In such embodiments, fullerene may constitute a relatively small fraction of the mixture. For example, fullerene may constitute less than about 15% by volume, less than about 10% by volume, less than about 8% by volume, less than about 5% by volume, less than about 3% by volume, less than about 2% by volume, or less than about 1% by volume of the mixture. The metal may constitute the remainder of the mixture. In some applications, it may be particularly advantageous for the electrode 210 to comprise, for example, less than 5% by volume or less than 2% by volume of fullerene, with the metal constituting the remainder of the electrode 210. For example, in applications where it is favourable for the electrode 210 to have a relatively high reflectivity and/or relatively low absorption, it may be preferable for the electrode 210 to contain a relatively small amount of fullerene, since fullerene generally absorbs light in the visible portion of the electromagnetic spectrum. Providing a relatively high concentration of fullerene in the electrode 210 may unfavorably result in reduced reflectivity and increased absorption of light incident on the electrode 210 at least in some cases. However, such unfavourable optical properties associated with fullerene may be reduced by providing a relatively low concentration of fullerene in the electrode 210.

In one embodiment, the electrode 210 comprises a mixture of fullerene and pure or substantially pure magnesium. In a further embodiment, fullerene may constitute less than about 2% by volume of the mixture, with pure or substantially pure magnesium constituting the remainder of the mixture.

In some embodiments, the electrode 210 and the first portion 220 comprises the same metal. In some embodiments, the first portion 220 and the second portion 230 comprises the same metal. In a further embodiment, the electrode 210, the first portion 220, and the second portion 230 comprise the same metal. For example, the electrode 210, the first portion 220, and the second portion 230 may comprise magnesium.

In some embodiments, barrier coating 215 comprising the first portion 220 and the second portion 230 are formed integrally or continuously. For example, the first portion 220 and the second portion 230 may be formed by continuously subjecting the target surface (e.g. the surface of the electrode 210 to the flux of the evaporated metal to deposit the metal on the surface of the electrode 210. The metal may be, for example, magnesium. The surface of the electrode 210 may also be subjected to the flux of evaporated fullerene to deposit fullerene at various stages of the formation of the barrier coating 215. For example, fullerene may be deposited during the stages corresponding to the formation of the first portion 220 and optionally the second portion 230 as will be described. During the formation or deposition of the barrier coating 215, the deposition rate of the metal and/or the deposition rate of fullerene may be varied to produce the coating with the desired composition and/or characteristics.

In some embodiments, the barrier coating 215 may be provided with one or more additional portions. For example, the one or more additional portions may be disposed between the first portion 220 and the second portion 230, or over the second portion 230. The one or more additional portions may comprise organic materials, inorganic materials, and/or combination thereof. For example, the one or more additional portions may comprise a polymer, a small-molecule organic compound, and/or an oxide such as silicon dioxide. In some embodiments, the barrier coating 215 may comprise a plurality of first portions 220. The barrier coating 215 may further comprise a plurality of second portions 230. In such embodiments, the first portions 220 and the second portions 230 may be arranged in alternating layers or stacked on top of one another. For example, a second portion 230 may be disposed between neighboring first portions 220, such that neighboring first portions 220 are separated by the second portion 230.

In some embodiments, the barrier coating 215 may be disposed over an opto-electronic device, or a portion thereof. An opto-electronic device is generally any device that converts electrical signals into photons or vice versa. As such, an organic opto-electronic device, as used herein, will be understood to be any opto-electronic device where the active layer(s) of the device are formed primarily of organic materials, and more specifically, organic semiconductor materials. Examples of organic optoelectronic devices include, but are not limited to, organic light emitting diode (OLED) devices and organic photovoltaic (OPV) devices. In another example, the opto-electronic device may be an electroluminescent quantum dots light-emitting device, wherein the electroluminescent layer of the device comprises quantum dots.

In one embodiment, the organic optoelectronic device is an organic light emitting diode, wherein the organic semiconductor layer comprises an electroluminescent layer. In other embodiments, the organic semiconductor layer may comprise additional layers, such as an electron injection layer, electron transport layer, hole transport layer, and/or hole injection layer.

In one embodiment, the barrier coating 215 is disposed over the surface of an organic coating or layer of an OLED device. Accordingly, in such embodiment, the substrate 200 may comprise one or more organic coatings or layers. For example, the barrier coating 215 may be disposed over a cathode 210, which is disposed over a charge injection layer or charge transport layer (e.g. the electron injection layer or electron transport layer) of an OLED device. In some embodiments, the barrier coating 215 may form at least a portion of an electrode, such as the cathode, of the OLED device. The substrate 200 may further comprise an electrode (e.g. a counter-electrode to the electrode 210). The substrate 200 may further comprise a base substrate onto which the electrode and the one or more organic coatings or layers are deposited.

In some embodiments, the thickness of the first portion 220 may be less than the thickness of the second portion 230. Since some fullerenes, such as $C_{60}$, are relatively expensive, it may be advantageous to reduce the thickness of the portion(s) of the coating containing fullerene. In addition, or alternatively, the concentration of fullerene within various portions of the coating may be reduced to provide a more cost-effective barrier coating.

For example, the thickness of the electrode 210 may be greater than about 5 nm, greater than about 10 nm, greater than about 25 nm, greater than about 50 nm, greater than about 75 nm, greater than about 100 nm, greater than about 150 nm, or greater than about 200 nm. For example, the thickness of the electrode 210 may be between about 20 to 500 nm, between about 20 to 300 nm, or between about 50 to 250 nm.

The thickness of the first portion 220 may be greater than about 1 nm, greater than about 10 nm, greater than about 20 nm, or greater than about 50 nm, for example. However, it may be particularly advantageous to provide a relatively thick coating of first portion 220 in some cases. For example, the thickness of the first portion 220 may be greater than about 80 nm, greater than about 100 nm, greater than about 150 nm, or greater than about 200 nm. For example, the thickness of the first portion 220 may be between about 50 to 500 nm, between about 50 to 250 nm, between about 80 to 200 nm, or between about 100 to 200 nm.

The thickness of the second portion 230 may be greater than about 50 nm, greater than about 80 nm, or greater than about 100 nm, for example. However, it may be particularly advantageous to provide a relatively thick coating of the second portion 230, at least in some cases where the second portion 230 acts as a getterer or a desiccant. By providing a relatively thick getterer or desiccant, the permeation of gases such as air or water vapor may be inhibited to a greater extent. For example, the thickness of the second portion 230 may be greater than about 120 nm, greater than about 150 nm, greater than about 200 nm, or greater than about 250 nm. For example, the thickness of the second portion 230 may be between about 50 to 500 nm, between about 100 to 400 nm, between about 100 to 300 nm, or between about 200 to 300 nm.

The total thickness of the barrier coating 215 may, for example, be greater than about 50 nm. However, particularly in cases wherein the barrier coating 215 is provided as a part of a reflective electrode (e.g. a cathode) of an opto-electronic device, it may be advantageous to provide a relatively thick barrier coating 215 to attain greater reflectivity and conductivity. For example, the thickness of the barrier coating 215 may be greater than about 80 nm, greater than about 100 nm, greater than about 150 nm, greater than about 200 nm, greater than about 300 nm, greater than about 500 nm, greater than about 700 nm, or greater than about 1000 nm. Particularly in cases wherein the barrier coating 215 is provided in a flexible device (e.g. a flexible OLED), it may be advantageous for the barrier coating 215 to have sufficient thickness for achieving the desirable electrical and optical properties, while being sufficiently thin to enable the device to remain flexible. Thick coatings containing metals are generally undesirable for use in many flexible device applications due to the mechanical properties of such coatings. Accordingly, in some embodiments, the thickness of the barrier coating 215 may be between about 100 to 5000 nm, between about 100 to 2500 nm, between about 100 to 2000 nm, between about 100 to 1500 nm, between about 100 to 1000 nm, between about 100 to 800 nm, between about 100 to 600 nm, between about 100 to 500 nm, between about 150 to 500 nm, between about 200 to 500 nm, or between about 300 to 500 nm.

However, it will be appreciated that the thicknesses of the first portion 220 and the second portion 230 may be varied depending on the application and the materials used to form the coating, and accordingly the thicknesses of the barrier coating and portions thereof may not be limited to any specific ranges specifically recited herein.

In the embodiment of FIG. 1, the electrode 210, the first portion 220, and the second portion 230 are illustrated as being disposed adjacent, or immediately adjacent to one another. Specifically, the first portion 220 is illustrated as being disposed immediately adjacent to the electrode 210 and the second portion 230, such that the first portion 220 is in direct contact with the electrode 210 and the second portion 230. Particularly in such embodiments, the electrode 210, the first portion 220, and the second portion 230 may be in electrical contact with one another. However, in other embodiments, additional layers or coatings may be disposed between the electrode 210 and the first portion 220, and/or between the first portion 220 and the second portion 230.

FIG. 2 is an OLED device 101 according to one embodiment wherein the device comprises the barrier coating 215. Specifically, the OLED device 101 comprises a base substrate 100, a first electrode 110, a plurality of organic layers 125, a second electrode 210, and the barrier coating 215. For example, the first electrode 110 may be an anode, and the second electrode 210 may be a cathode. The barrier coating 215 may also act as a part of the cathode in some embodiments.

The plurality of organic layers 125 in the embodiment of FIG. 2 comprises a hole injection layer 120, a hole transport layer 130, an electroluminescent layer 140, an electron transport layer 150, and an electron injection layer 160. The hole injection layer 120 may be formed using a hole injection material which generally facilitates the injection of holes by the anode 110. The hole transport layer 130 may be formed using a hole transport material, which is generally a material that exhibits high hole mobility. The electroluminescent layer 140 may be formed, for example, by doping a host material with an emitter material. The emitter material may be a fluorescent emitter, a phosphorescent emitter, or a TADF emitter, for example. A plurality of emitter materials may also be doped into the host material to form the electroluminescent layer 140. The electron transport layer 150 may be formed using an electron transport material which generally exhibits high electron mobility. The electron injection layer 160 may be formed using an electron injection material, which generally acts to facilitate the injection of electrons by the cathode.

It will be understood that the structure of the device 101 may be varied by omitting or combining one or more layers. Specifically, one or more of the hole injection layer 120, the hole transport layer 130, the electron transport layer 150, and the electron injection layer 160 may be omitted from the device structure. One or more additional layers may also be present in the device structure. Such additional layers include, for example, a hole blocking layer, an electron blocking layer, and additional charge transport and/or injection layers. Each layer may further include any number of sub-layers, and each layer and/or sub-layer may include various mixtures and composition gradients. It will also be appreciated that the device 101 may include one or more layers containing inorganic and/or organo-metallic materials, and is not limited to devices composed solely of organic materials. For example, the device 101 may include quantum dots.

It will also be appreciated that the device 101 may be formed on various types of base substrates. For example, the base substrate 100 may be a flexible or rigid substrate. The base substrate 100 may include, for example, silicon, glass, metal, polymer (e.g., polyimide), sapphire, or other materials suitable for use as the base substrate. The base substrate 100 may further include a plurality of thin film transistors (TFTs) in the case of active-matrix organic light-emitting diode (AMOLED) display device.

The device 101 illustrated in FIG. 2 may be a bottom-emission OLED device, wherein the device is configured to emit light in a direction towards the base substrate 100. Accordingly, in such embodiment, the first electrode 110 (e.g. the anode) may be substantially transparent or light-transmissive, and the second electrode 210 may be substantially reflective in the visible wavelength portion of the electromagnetic spectrum. In such embodiments, portions of the barrier coating 215 may also be substantially reflective in the visible wavelength portion of the electromagnetic spectrum. In some embodiments, the second electrode 210 and the first portion 220 may, together, form the cathode of the device 101. In yet another example, the second electrode 210, the first portion 220, and the second portion 230 may collectively form the cathode of the device 101. Accordingly, at least a portion of the barrier coating 215 (e.g. the first portion 220) may be electrically conductive. In one embodiment, the first portion 220 and the second portion 230 are electrically conductive. In a further embodiment, the second electrode 210, the first portion 220, and the second portion 230 may be electrically connected to one another to allow electrical current to pass through the barrier coating 215 into the organic layers 125.

As used herein, the term "reflective" would generally be understood to mean that the light incident on a coating or a layer is reflected. For example, a reflective coating or layer may cause greater than 40%, greater than 50%, greater than 60%, greater than 70%, greater than 75%, greater than 80%, greater than 90%, or greater than 95% of the light incident thereon to be reflected.

In one aspect, a method for forming a barrier coating is provided. The method includes (i) depositing a conductive material to form a conductive coating on a surface of a substrate, (ii) co-depositing fullerene and the conductive material to form a first portion over the conductive coating, and (iii) depositing the conductive material to form a second portion over the first coating.

FIG. 3A-3H illustrate various embodiments of forming the electrode 210 on a surface 204 of a substrate 200.

In FIG. 3A, the conductive coating or an electrode 210 is deposited on the surface 204 of the substrate 200, such that the electrode 210 is in direct contact with the surface 204. In some embodiments, the electrode 210 comprises a metal. For example, the metal may be a metallic element such as, for example, an alkali metal, an alkaline earth metal, a lanthanide, a transition metal, post-transition metal, or any combination thereof. The metal may be an alloy. For example, the electrode 210 may comprise magnesium (Mg), zinc (Zn), aluminum (Al), ytterbium (Yb), silver (Ag), or any combination thereof including alloys. For example, the alloy may be a Mg:Ag alloy having a composition range of between about 1:10 and 10:1 by volume or by atomic composition ratio, or a Mg:Yb alloy having a composition range of between about 1:10 and 10:1 by volume or by atomic composition ratio.

Although various materials may be used to form the electrode 210 it may be advantageous to form the electrode 210 using magnesium. For example, when compared to aluminum which is a material typically used to form the cathode of an OLED device, magnesium has a lower work function of 3.6 eV. Magnesium can also be thermally deposited at much lower deposition temperatures, for example, 400° C. or less, which is substantially lower than the deposition temperature of aluminum, and is therefore more cost effective and easier to process.

However, it has been previously reported that substantially pure magnesium cannot be used as an effective cathode for organic optoelectronic devices, since its adhesion to organic materials is poor and its environmental stability is low. For example, US Publication No. 2012/0313099 further describes magnesium's poor adhesion to organic surfaces. Additionally, magnesium is prone to oxidation and, as such, devices with magnesium cathodes are difficult to manufacture and operate under oxygen and/or humid environments since the conductivity of the cathode quickly deteriorates as magnesium oxidizes. Although it is possible to deposit magnesium on various inorganic surfaces such as those of glass and silicon, the sticking coefficient of magnesium on these surfaces is generally low. As such, the deposition rate of magnesium on such surfaces is relatively low and the process is not cost-effective.

Figure 3B:
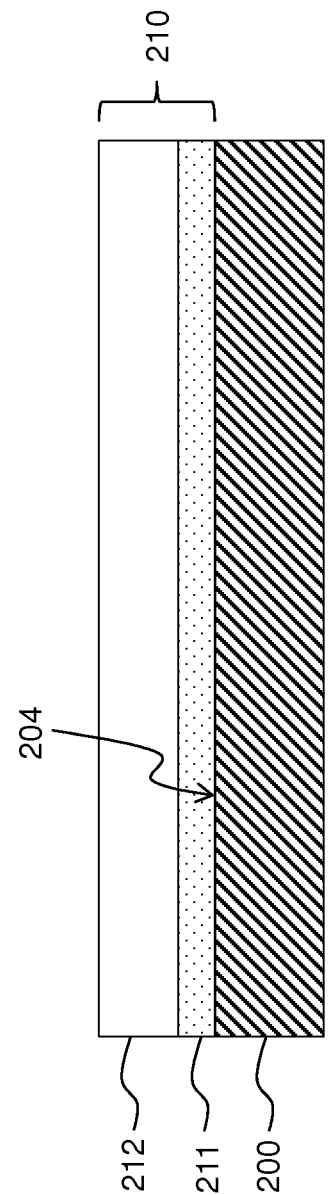

Accordingly, in one embodiment illustrated in FIG. 3B, a nucleation promoting coating 211 may be provided. Specifically, in the embodiment of FIG. 3B, the electrode 210 comprises the nucleation promoting coating 211 disposed on the surface 204, and a metallic coating 212 disposed over the nucleation promoting coating 211. The nucleation promoting coating 211 may comprise, for example, fullerene. The metallic coating 212 may comprise magnesium. For example, the metallic coating 212 may comprise pure or substantially pure magnesium.

Based on previous findings and experimental observations, the inventors postulate that the nucleation promoting coating comprising fullerene, as will be explained further herein, act as nucleation sites for the deposition of magnesium. For example, in cases where magnesium or magnesium alloy is deposited using an evaporation process on a fullerene treated surface, the fullerene molecules act as nucleation sites for initiating condensation (i.e. desublimation) of the magnesium or magnesium alloy. It has also been observed that less than a monolayer of fullerene may be provided on the treated surface to act as nucleation sites for successful deposition of magnesium in some cases. As will be understood, treating the surface by depositing several layers of fullerenes may result in a higher number of nucleation sites.

However, it will be appreciated that the amount of fullerene deposited on the surface may be more, or less, than one monolayer. For example, the surface may be treated to produce a nucleation promoting coating by depositing less than about 0.1 monolayers, less than about 0.2 monolayers, less than about 0.3 monolayers, less than about 0.4 monolayers, less than about 0.5 monolayers, less than about 0.6 monolayers, less than about 0.7 monolayers, less than about 0.8 monolayers, less than about 0.9 monolayers, or less than about 1 monolayer. Additionally, a nucleation promoting coating may be formed by depositing greater than about 1 monolayer, greater than about 10 monolayers, or more of fullerene. As used herein, depositing 1 monolayer of fullerene will be understood to mean that the amount of fullerene deposited on the surface is equivalent to the amount of fullerene required to cover the desired area of the surface with a single layer of fullerene molecules. Similarly, as used herein, depositing 0.1 monolayer of fullerene will be understood to mean that the amount of fullerene deposited on the surface is equivalent to the amount of fullerene required to cover 10% of the desired area of the surface with a single layer of fullerene molecules. It will be appreciated that due to stacking of fullerene molecules, a single monolayer of coverage may leave certain areas of a substrate without coverage of a fullerene layer while other areas of the substrate may have 2 or more layers of fullerene coverage.

Figure 3C:
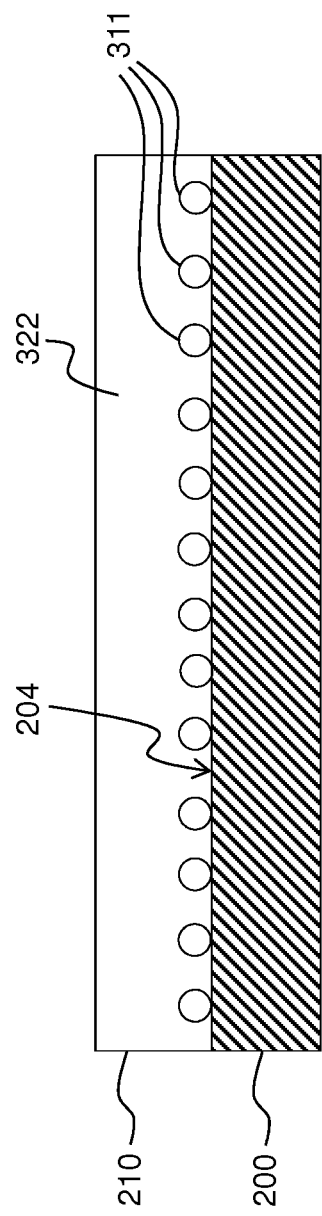
Figure 4A:
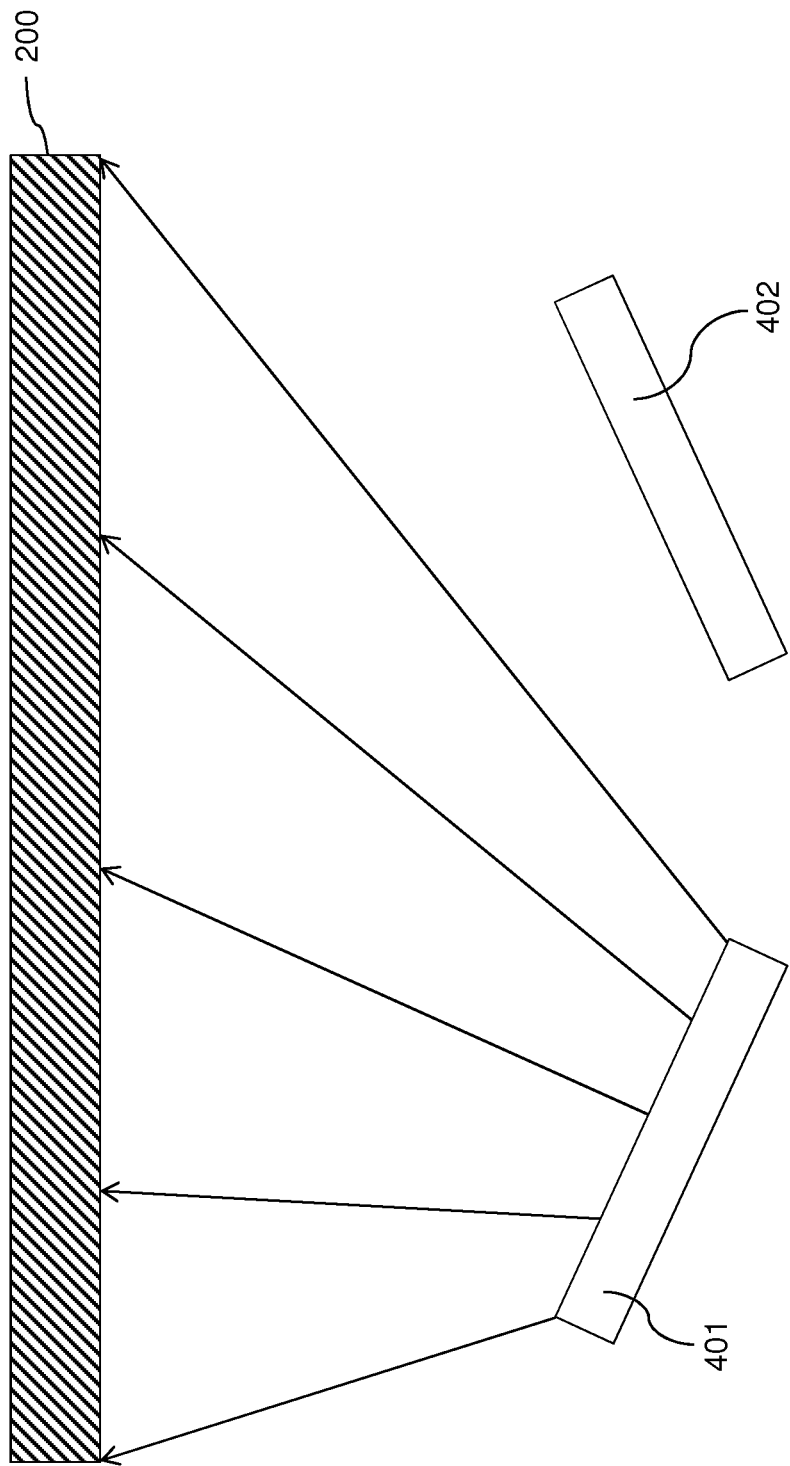
FIGS. 4A and 4B are diagrams illustrating a method for depositing the electrode according to one embodiment.
Figure 4B:
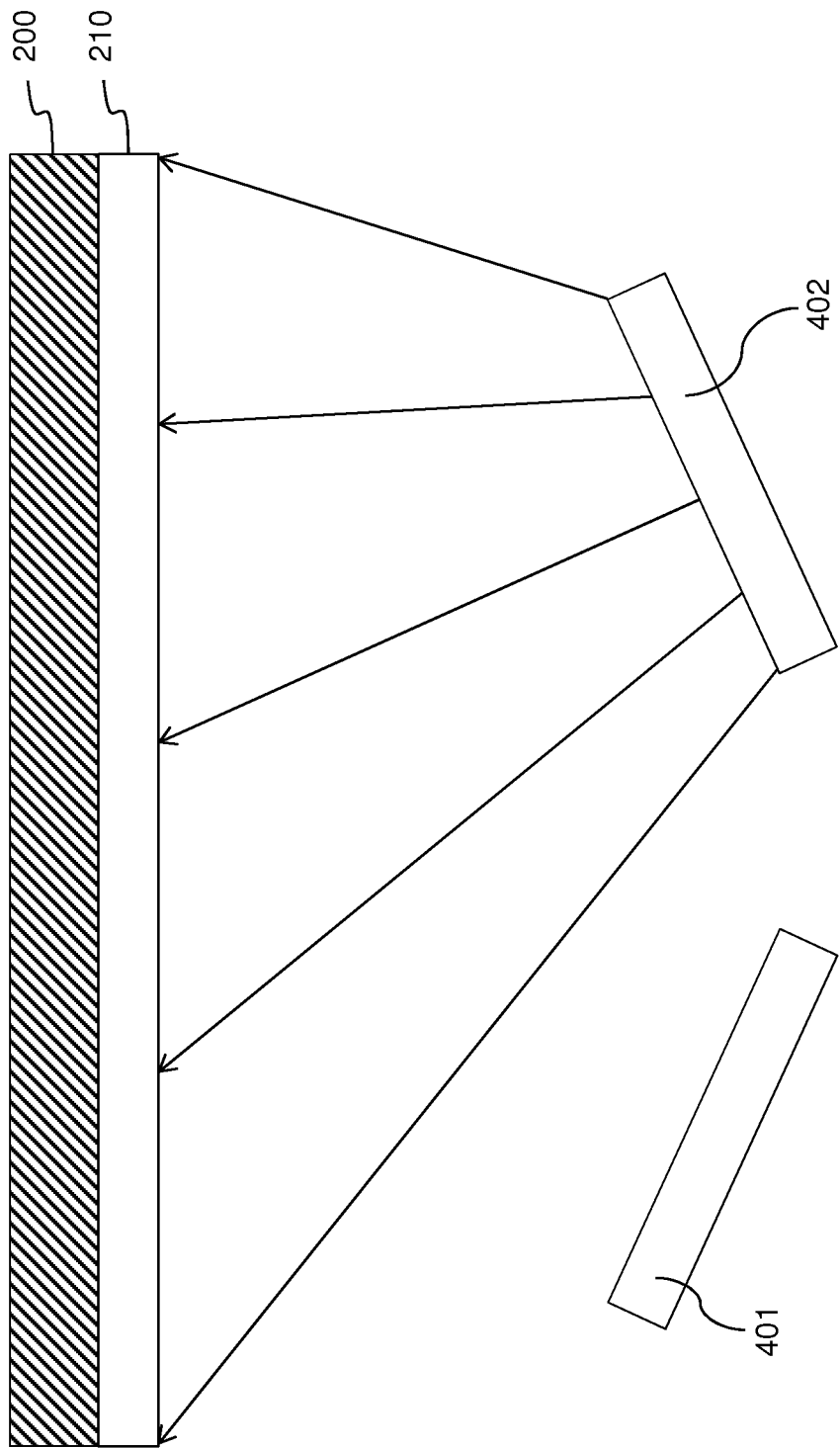

In the embodiment illustrated in FIG. 3C, less than a monolayer of fullerene 311 is disposed at the interface between the electrode 210 and the substrate 200. Specifically in the illustrated embodiment, a sub-monolayer of nucleation promoting coating formed by fullerene 311 is provided at the surface 204 of the substrate. The electrode 210 is formed by depositing a coating comprising a metal 322 (e.g. magnesium) on the sub-monolayer nucleation promoting coating. The process for depositing the electrode 210 according to one embodiment is further illustrated in FIGS. 4A and 4B. As illustrated in FIG. 4A, a sub-monolayer nucleation promoting coating comprising fullerene 311 is deposited onto the substrate 200 by evaporating a fullerene source material (not shown) at the first source 401 and causing the fullerene vapor flux to be incident on the substrate 200. As depicted in FIG. 4B, once fullerene 311 has been deposited, a second source 402 is used to evaporate a metal source material (not shown) and causing the evaporated metal flux to be incident on the fullerene-treated surface. In this way, the conductive coating 210 illustrated in FIG. 3C may be formed.

As described above with reference to FIG. 3C, fullerene may not completely cover the surface 204 of the substrate 200, thereby leaving a substantial portion of the surface 204 of the substrate 200 uncovered. Alternatively, the surface 204 of the substrate 100 may be completely covered by fullerene. Once the surface 204 of the substrate 200 has been treated, a metal such as magnesium may be deposited by the source to form a conductive coating on the electrode 210. It is postulated that fullerene on the surface of the substrate 200 may act as nucleation sites, which allow the magnesium to bind to the fullerene molecules and subsequently grow to form a conductive coating. It is further postulated that the spaces or gaps between the fullerene molecules on the treated surface are gradually filled with magnesium as magnesium is deposited by the metal source.

Figure 3D:
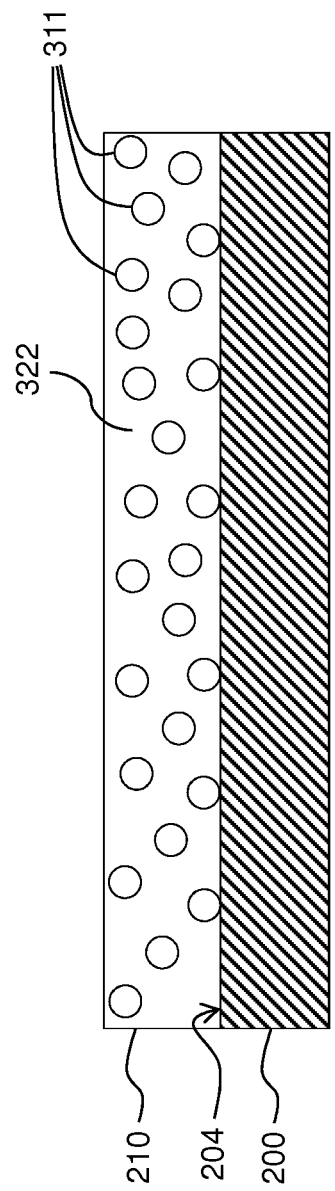
Figure 5:
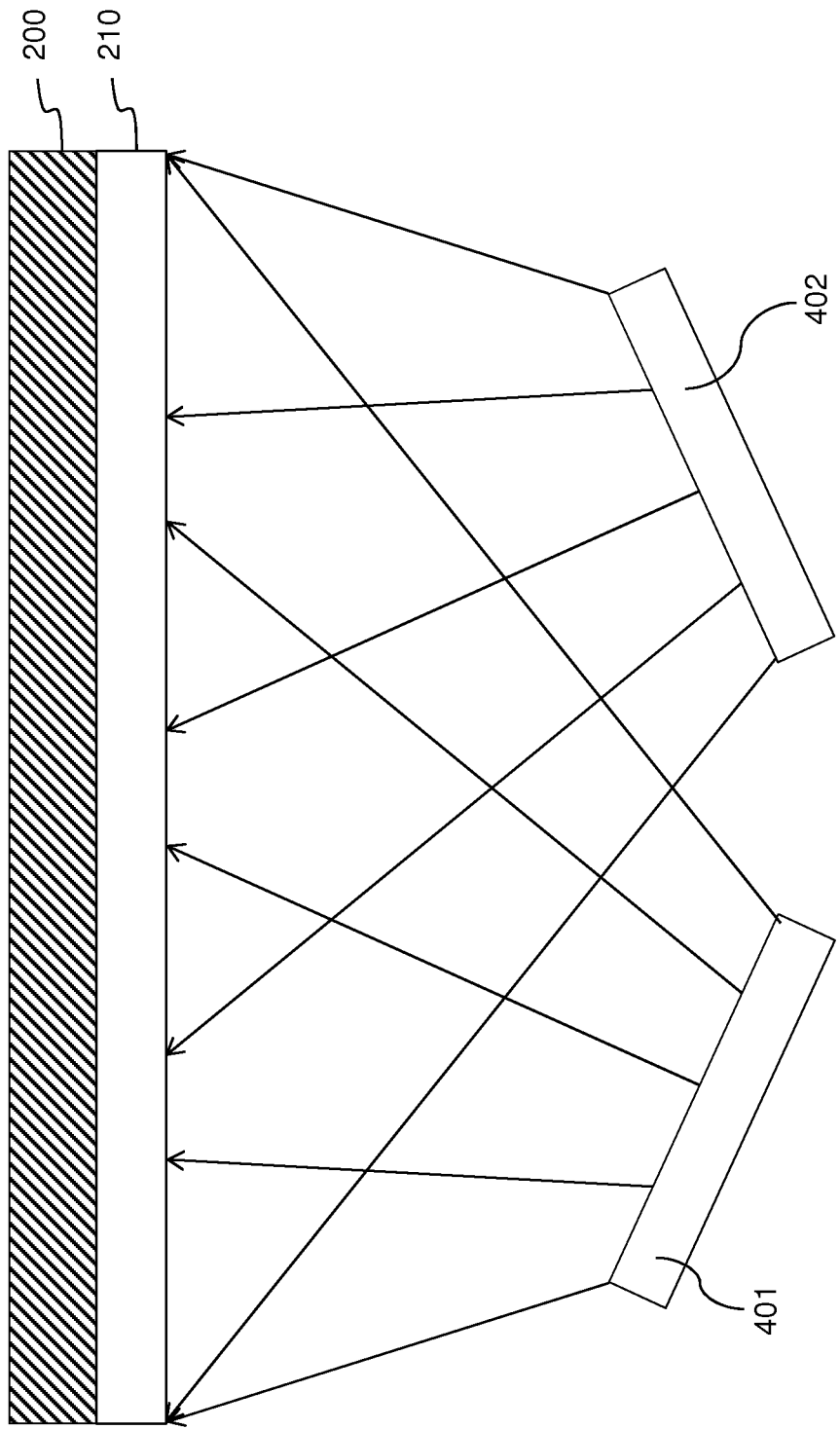
FIG. 5 is a diagram illustrating a method for depositing the electrode according to another embodiment.

FIG. 3D illustrates another embodiment wherein the electrode 210 comprises fullerene 311 dispersed within the metal 322 (e.g. magnesium). For example, such coating may be formed by simultaneously co-depositing fullerene 311 and the metal 322 onto the surface 204 of the substrate 200. The process for depositing the electrode 210 according to one embodiment is further illustrated in FIG. 5. In FIG. 5, fullerene 311 is deposited by evaporating a fullerene source material (not shown) using a first source 401 to cause the fullerene vapor flux to be incident on the substrate 200, while simultaneously, evaporating a metal source material (not shown) using a second source 402 to cause the evaporated metal flux to be incident on the substrate 200. Alternatively, the electrode 210 may be formed by evaporating a common source material comprising a mixture of fullerene and the metal, and subjecting the substrate 200 to the evaporated flux of fullerene and the metal. For example, such process may be conducted using a single evaporation source. It will be appreciated that, in the embodiment of FIG. 3D, while fullerene is dispersed throughout the electrode 210, at least some fullerene may be provided at the interface between the electrode 210 and the substrate 200 to act as the nucleation promoting coating.

FIG. 3E illustrates yet another embodiment wherein a sub-monolayer nucleation promoting coating is provided within the substrate 200. For example, the substrate may comprise an electron injection layer onto which the electrode 210 is deposited. In such case, fullerene 311 may be "doped" or disposed within the substrate (e.g. the electron injection layer), particularly at the interface between the substrate 200 and the electrode 210, to provide a fullerene-treated surface onto which the metal 322 may be deposited.

FIG. 3F illustrates yet another embodiment wherein fullerene 311 is dispersed within at least a portion of the substrate 200. For example, the substrate may comprise an electron injection layer onto which the electrode 210 is deposited. In such case, fullerene 311 may be doped or dispersed throughout the substrate (e.g. the electron injection layer) to provide a fullerene-treated surface onto which the metal 322 may be deposited. In particular, fullerene 311 may be provided at the interface between the substrate 200 and the electrode 210.

Figure 3G:
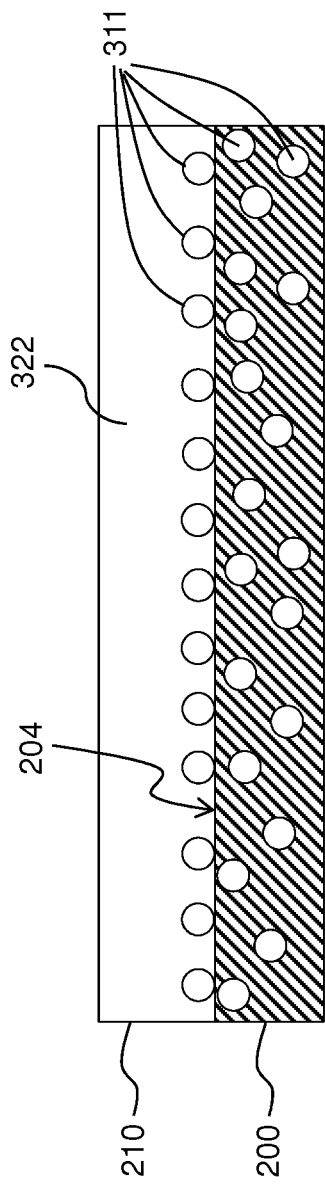

FIG. 3G is an embodiment wherein fullerene 311 is dispersed within at least a portion of the substrate 200, and in addition, the surface 204 of the substrate 200 has been treated by depositing a sub-monolayer fullerene nucleation promoting coating thereon prior to depositing the metal 322 to form the electrode 210.

Figure 3H:
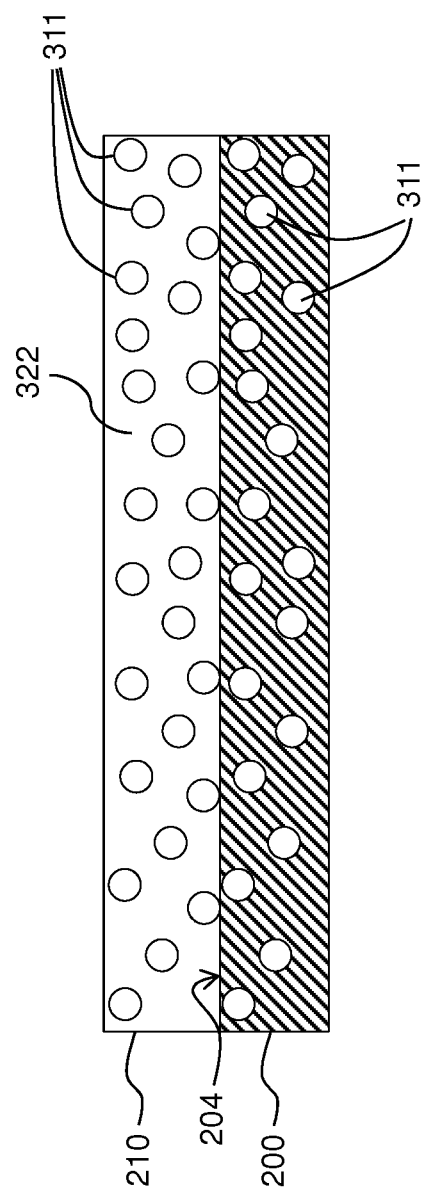

FIG. 3H is another embodiment wherein fullerene 311 is dispersed within both the substrate 200 and the electrode 210 comprising the metal 322. As would be understood, fullerene may be disposed particularly at the interface between the electrode 210 and the substrate 200.

FIG. 6A-6D illustrate various embodiments for forming the first portion 220 over the electrode 210.

In FIG. 6A, the first portion 220 is deposited over the electrode 210. The first portion 220, for example, comprises fullerene dispersed within a metal. The metal may include magnesium. Fullerene may be dispersed substantially uniformly or evenly throughout the first portion 220. Alternatively, fullerene concentration may be varied throughout the first portion 220.

In FIG. 6B, the first portion 220 is illustrated as comprising a first region 221 and a second region 222. The first region 221 is disposed proximal to the substrate 200 and the second region 222 is disposed distal to the substrate 200. For example, the first region 221 may be deposited over the electrode 210, such that the electrode 210 is in contact with the first region 221. The first region 221 and the second region 222 may be formed continuously or integrally with each other. In the illustrated embodiment, both the first region 221 and the second region 222 comprise fullerene 226 and a metal 228. The metal 228 may include, for example, magnesium. The metal 228 may be pure or substantially pure magnesium. The first region 221 may contain a higher concentration of fullerene 226 compared to the second region 222. For example, fullerene 226 may be disposed at the interface between the first portion 220 and the electrode 210.

Figure 6C:
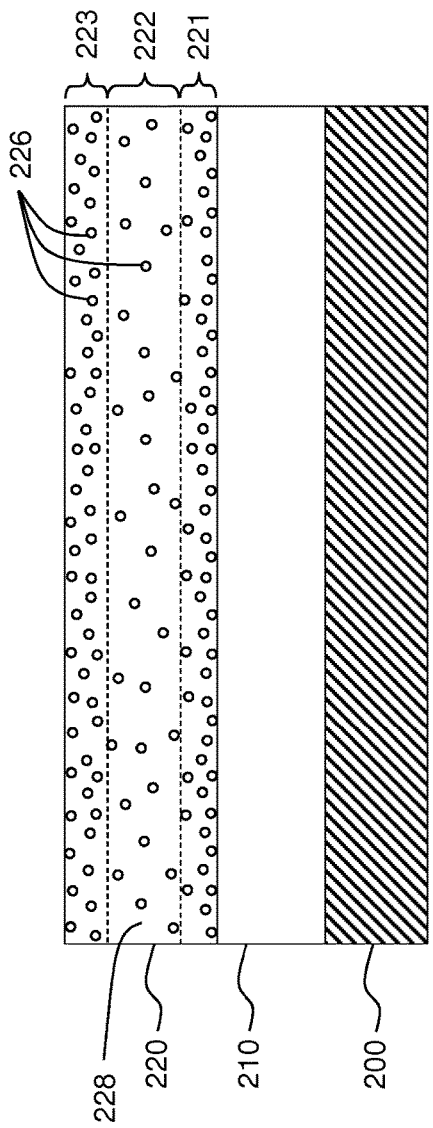

In FIG. 6C, the first portion 220 is illustrated as comprising a first region 221, a second region 222, and a third region 223. The first region 221 is disposed proximal to the substrate 200, the third region 223 is disposed distal to the substrate 200, and the second region 222 is disposed between the first region 221 and the third region 223. For example, the first region 221 may be disposed over the electrode 210, such that the electrode 210 is in contact with the first region 221. The first region 221, the second region 222, and the third region 223 may be formed continuously or integrally with one another. In the illustrated embodiment, the first region 221, the second region 222, and the third region 223 each comprise fullerene 226 and a metal 228. The metal 228 may include, for example, magnesium. The metal 228 may be pure or substantially pure magnesium. The first region 221 may contain a higher concentration of fullerene 226 compared to the second region 222. The third region 223 may also contain a higher concentration of fullerene 226 compared to the second region 222. The first region 221 may contain a higher, lower, or substantially the same concentration of fullerene compared to the third region 223. Fullerene 226 may be disposed at the interface between the first portion 220 and the electrode 210, particularly in cases where the metal 228 cannot readily be deposited on the electrode 210.

Figure 6D:
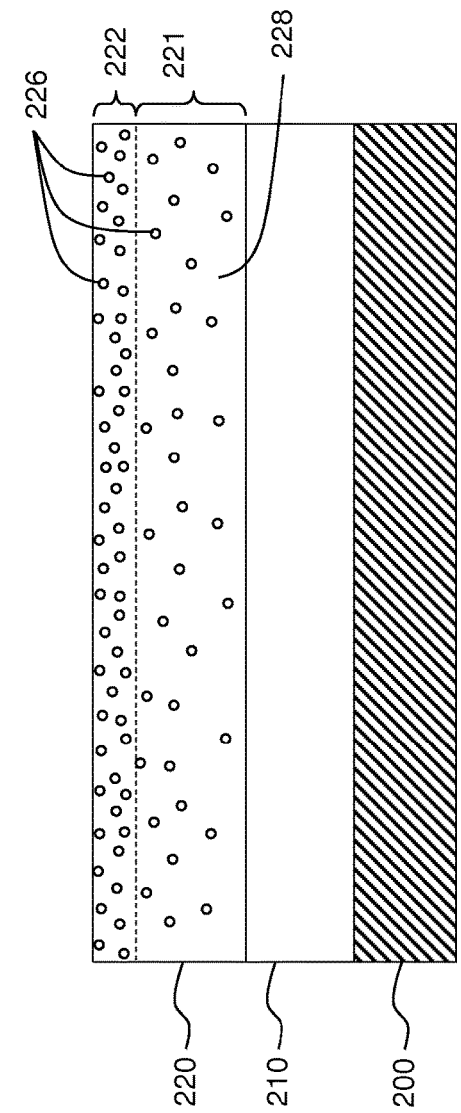

In FIG. 6D, the first portion 220 is illustrated as comprising a first region 221 and a second region 222. The first region 221 is disposed proximal to the substrate 200 and the second region 222 is disposed distal to the substrate 200. For example, the first region 221 may be deposited over the electrode 210, such that the electrode 210 is in contact with the first region 221. The first region 221 and the second region 222 may be formed continuously or integrally with each other. In the illustrated embodiment, both the first region 221 and the second region 222 comprise fullerene 226 and a metal 228. The metal 228 may include, for example, magnesium. The metal 228 may be pure or substantially pure magnesium. The second region 222 may contain a higher concentration of fullerene 226 compared to the first region 221. Although not specifically illustrated in FIG. 6, in some embodiments, fullerene 226 may be disposed at the interface between the first portion 220 and the electrode 210.

Figure 7:
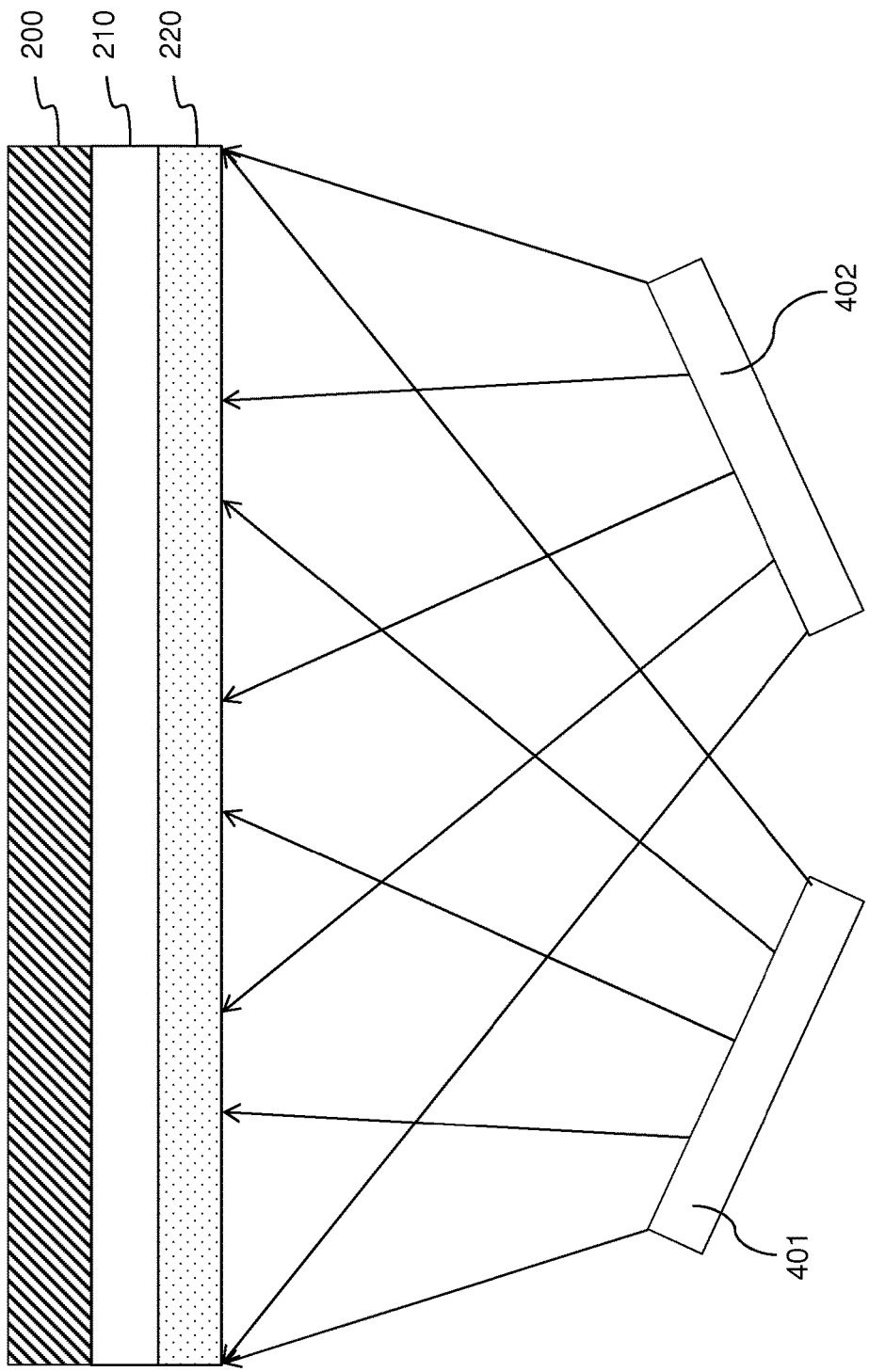
FIG. 7 is a diagram illustrating a method for depositing a first portion of a barrier coating according to one embodiment.

Various embodiments of the first portion 220 illustrated in FIGS. 6A-6D may, for example, be formed by co-depositing the metal 228 and fullerene 226 from respective evaporation sources. FIG. 7 illustrates one embodiment of such process, wherein the first portion 220 deposited by subjecting the substrate 200 having an electrode 210 disposed thereon to evaporated flux emanating from the first source 401 and the second source 402. Specifically, the first source 401 may be configured to evaporate a fullerene source material (not shown) to generate a fullerene vapor flux, and the second source 402 may be configured to evaporate a metal source material (not shown) to generate a metal vapor flux. The surface of the electrode 210 may then be concurrently or simultaneously subjected to the fullerene vapor flux and metal vapor flux, thus causing the first portion 220 comprising fullerene and the metal to be deposited over the electrode 210. The deposition rate and/or the evaporation rate of the first source 401 and the second source 402 may be modulated or adjusted to vary the concentration of fullerene in various regions or portions of the first portion 220.

Figure 8:
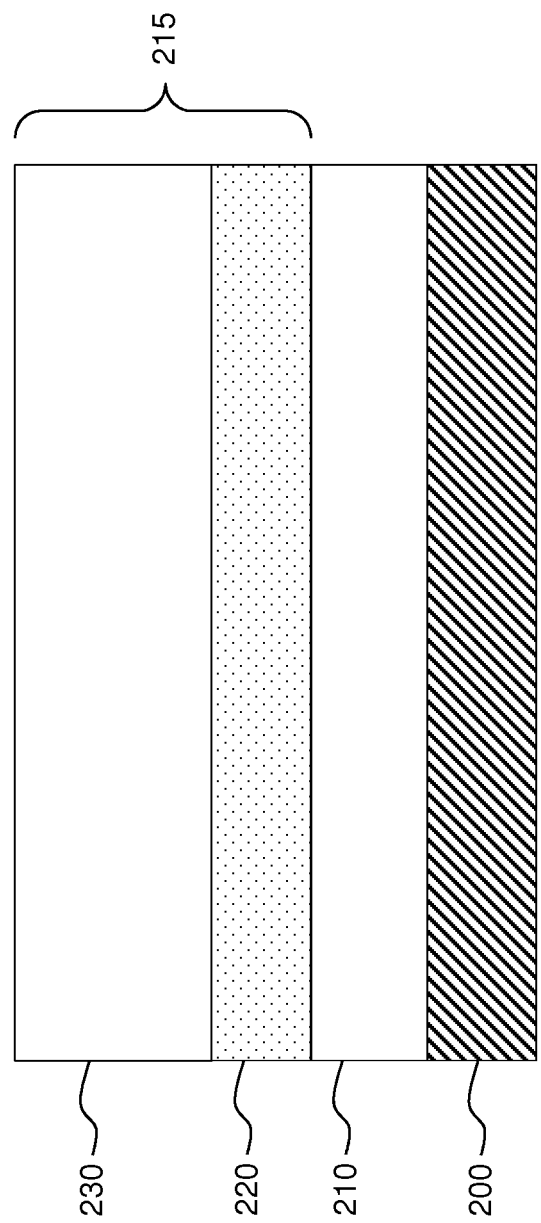
FIG. 8 is a diagram illustrating a second portion of a barrier coating according to one embodiment.
Figure 9:
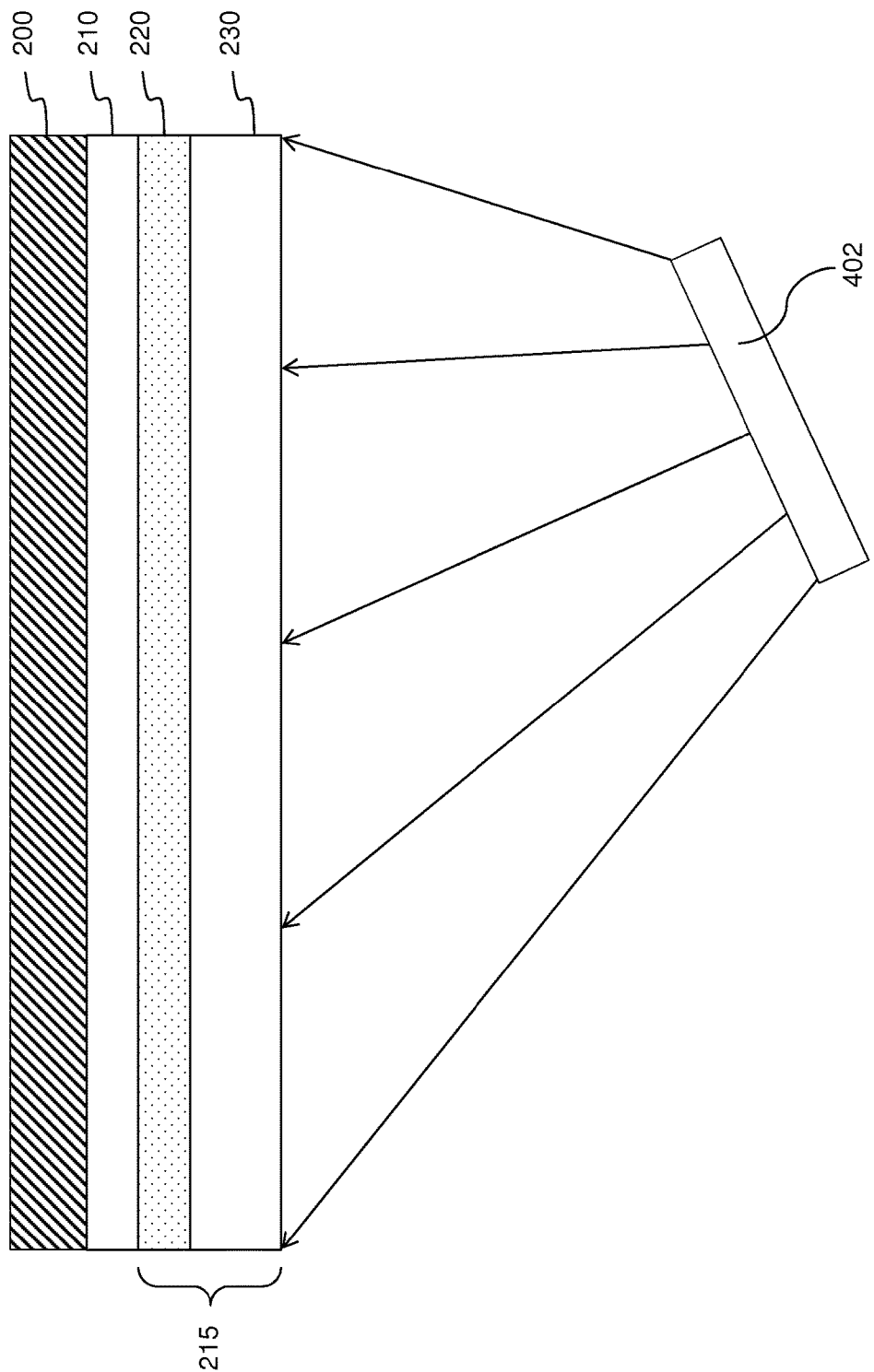
FIG. 9 is a diagram illustrating a method for depositing a second portion of a barrier coating according to one embodiment.

FIG. 8 illustrates the second portion 230 deposited on top of the first portion 220. In some embodiments, the second portion 230 may comprise a metal. For example, the metal may include magnesium. The metal may be pure or substantially pure magnesium. FIG. 9 illustrates the second portion 230 being deposited according to one embodiment. In the embodiment of FIG. 9, the substrate 200 having the electrode 210 and the first portion 220 deposited thereon is subjected to evaporated metal flux from the source 402 to cause the second portion 230 to be deposited over the first portion 220. Specifically, the source 402 is configured to evaporate the source material comprising the metal to generate a metal vapor flux. The surface of the first portion 220 may be subjected to the metal vapor flux to cause the second portion 230 comprising the metal to be deposited thereon.

In some embodiments, the same source may be used to deposit the metal for forming the first portion 220 and the second portion 230. In such embodiments, the first portion 220 and the second portion 230 may comprise the same metal. In some embodiments, the same source may be used to deposit the metal for forming the electrode 210, the first portion 220, and the second portion 230. In such embodiments, the electrode 210, the first portion 220, and the second portion 230 may comprise the same metal. For example, the metal may include magnesium. The metal may be pure or substantially pure magnesium. For example, with reference to the various embodiments described above, the source 402 may be used to deposit the metal for forming the electrode 210, the first portion 220, and the second portion 230. In one embodiment, the source 402 may be configured to maintain substantially the same deposition rate and/or evaporation rate during the formation or deposition of the electrode 210, the first portion 220, and the second portion 230. In another embodiment, the source 402 may be configured to deposit the metal at a first deposition rate during the deposition of the electrode 210, a second deposition rate during the deposition of the first portion 220, and a third deposition rate during the deposition of the second portion 230. In some embodiments, the first deposition rate may be substantially the same as the second deposition rate, and the third deposition rate may be greater than the first deposition rate or the second deposition rate. In other embodiments, the first deposition rate and/or the second deposition rate may be less than the third deposition rate. It is postulated that, at least in some cases, higher deposition rate of a metal may result in formation of a metal coating or layer having a smaller average grain size. As will be explained further, it may be particularly favorable to achieve a higher deposition rate of metal during the formation of the first portion 220 such that the average grain size of such portion is relatively small.

It will be appreciated that additional steps may be conducted subsequent to, and/or prior to the deposition of the electrode 210, the first portion 220, and the second portion 230. For example, such additional steps may include deposition of an additional portion to the barrier coating 215 and/or an additional barrier coating over the barrier coating 215. The additional portion may include an additional first portions and/or an additional second portion. Similarly, the additional barrier coating may comprise a first portion and a second portion, which may be defined in substantially the same manner as the first portion 220 and the second portion 230 of the barrier coating 215, respectively. For example, each portion of the additional barrier coating may possess substantially the same composition as the respective portions described above with regards to the barrier coating 215. As would be understood, any number of additional portions or additional barrier coatings may be provided, including, for example, 2, 3, 4, 5, or more additional portions or additional barrier coatings. Such additional portions or additional barrier coatings may also be formed integrally or continuously with the barrier coating 215.

As illustrated in FIG. 9, the barrier coating 215 may be deposited on a surface of the electrode 210, which is disposed on the substrate 200. It will be appreciated that the substrate 200 may comprise organic and/or inorganic materials. Accordingly, it will also be appreciated that the surface of such substrate may be any organic and/or inorganic surface upon which the electrode 210 can be deposited. For further clarity, it will be understood that the electrode 210 may be deposited on the surface using any method or process known in the art. In cases where the electrode 210 comprises fullerene deposited on the surface 204 of the substrate 200, fullerene deposited on the surface may be weakly or strongly bound to the surface by intermolecular forces, intramolecular forces, and any other type of forces, interaction and/or bonds. For example, fullerene may be bound to the surface by Van der Waals forces, electrostatic forces, gravitational forces, magnetic forces, dipole-dipole interactions, non-covalent interactions, and/or covalent bonds.

It will be appreciated that the organic substrate or organic surface, as used herein, will be understood to mean a substrate or surface primarily comprising an organic material. For greater clarity, an organic material will generally be understood to be any material containing carbon, wherein at least one carbon atom is covalently bonded to an atom of another type (e.g. hydrogen, oxygen, nitrogen, etc). Specifically, it has been observed that the barrier coating 215 may be deposited using a method according to the present invention on surfaces of materials commonly used as the electroluminescent layer or the electron injection layer of organic light emitting diodes. In some embodiments, the surface may be an organic surface. For example, the method may comprise depositing an electrode 210 on the surface of an organic layer of an organic electronic device, such as an OLED. In a more specific example, the method comprises depositing the electrode 210 on the surface of an electron transport layer (ETL) or electron injection layer (EIL). The ETL or EIL may contain fullerene.

It will also be appreciated that inorganic substrate or surface, as used herein, will be understood to mean a substrate comprising or primarily comprising an inorganic material. For greater clarity, an inorganic material will generally be understood to be any material that is not considered to be an organic material. Examples of inorganic materials include metals, glass, and minerals. The surfaces on which the methods according to the present invention may be applied include those of silicone-based polymers, inorganic semiconductor materials, electron injection materials, salts, metals, and metal oxides.

It will be appreciated that the substrate 200 may comprise a semiconductor material, and accordingly, the surface of such substrate may be a semiconductor surface. A semiconductor may be described as a material which has electrical conductivity to a degree less than that of a conductor (e.g. metal) but greater than that of an insulator (e.g. glass). It will be understood that a semiconductor material may be an organic semiconductor or an inorganic semiconductor. Some examples of organic semiconductor material are listed above. Some examples of inorganic semiconductor materials include Group IV elemental semiconductors, Group IV compound semiconductors, Group VI elemental semiconductors, Group III-V semiconductors, Group II-VI semiconductors, Group I-VII semiconductors, Group IV-VI semiconductors, Group IV-VI semiconductors, Group V-VI semiconductors, Group II-V semiconductors, oxides and other semiconductor materials.

Furthermore, it will be appreciated that the substrate 200 may comprise multiple layers of organic and/or inorganic materials. For example, the substrate may comprise an electron injection layer, an electron transport layer, an electroluminescent layer, a hole transport layer, a hole injection layer and/or an anode in a case of an organic light-emitting diode (OLED).

In various embodiments, fullerene and the metal for forming the barrier coating 215 have been described as being deposited using an evaporation process. As will be understood, an evaporation process is a type of physical vapor deposition (PVD) process, wherein one or more source materials are evaporated or sublimed under a vacuum environment and deposited on a target surface through condensation of the one or more evaporated source materials. A variety of different evaporation sources may be used for heating the source material, and as such, it will be appreciated that the source material may be heated in various ways. For example, the source material may be heated by an electric filament, electron beam, inductive heating, or by resistive heating.

By way of example, the deposition conditions for $C_{60}$ fullerenes may be approximately 430 to 500° C. at a pressure of $10^{-7}$ Torr, thereby producing a deposition rate on the order of about 0.1 angstroms per second. The deposition conditions for magnesium may be approximately 380 to 430° C. in a Knudsen cell at a pressure of approximately $10^{-7}$ Torr, thereby producing a deposition rate on the order of about 2 or more angstroms per second. However, it will be appreciated that other deposition conditions may be used.

For example, in cases where the metal is a magnesium, the magnesium may be deposited at 600° C. to achieve a faster rate of deposition such as 10 to 30 nm per second or more. Referring to Table 1, below, various example deposition rates measured using a K-cell magnesium deposition source to deposit substantially pure magnesium on a fullerene-coated organic surface of approximately 1 nm. It will be appreciated that various other factors also affect the deposition rate including but not limited to the distance between the source and the substrate, the characteristics of the substrate, the fullerene coverage on the substrate, the type of source used, the shaping of the flux of material from the source. Examples of the evaporation temperature and deposition rate for substantially pure magnesium in one evaporation chamber configuration are provided in Table 1 below.

TABLE 1

Mg Deposition Rate by Temperature

| Sample | Temperature (° C.) | Rate (angstroms/s) |
|---|---|---|
| 1 | 510 | 10 |
| 2 | 525 | 40 |
| 3 | 575 | 140 |
| 4 | 600 | 160 |

It will be appreciated by those skilled in the art that the particular processing conditions used are variable and may depend on the equipment being used to conduct the deposition. It will also be appreciated that higher deposition rates are generally reached at higher temperatures, however, particular deposition conditions can be selected by those skilled in the art, for example by placing the substrate closer to the deposition source.

It is known that both magnesium and Buckminsterfullerene ($C_{60}$) have similar sublimation temperatures (~400° C.) under high vacuum conditions (e.g. pressures below ~$10^{-1}$ torr). As such, in some embodiments, both magnesium and $C_{60}$ may be deposited using an evaporation deposition process from a single common deposition source which deposits a mixture of Mg and $C_{60}$ source materials to form the barrier coating.

Although the method has been described with reference to evaporation for purposes of depositing fullerene and the metal, it will be appreciated that various other methods may be used to deposit these materials. For example, fullerene and/or metal may be deposited using other physical vapor deposition (PVD) processes, including sputtering, for example. Other processes which may be used to deposit fullerene and/or metal include chemical vapor deposition (CVD) processes, printing (including ink or vapor jet printing and reel-to-reel printing), organic vapor phase deposition (OVPD), laser induced thermal imaging (LITI) patterning or other processes known for depositing fullerene or the metal. In one embodiment, the metal is deposited by heating a magnesium source material using a resistive heater. In other embodiments, a metal source material may be loaded in a heated crucible, a heated boat, a Knudsen cell, or any other type of evaporation source. Similarly, fullerene source material or a mixture of fullerene and metal source material may be loaded in a heated crucible, a heated boat, a Knudsen cell, or any other type of evaporation source for deposition. Various other methods of deposition may be used.

In embodiments wherein the metal is magnesium, a deposition source material used to deposit magnesium may be a mixture or a compound, wherein at least one of the components of the mixture or compound is not deposited on the substrate during the deposition. In one example the source material may be a Cu—Mg mixture or Cu—Mg compound. In a more specific example the source material for a magnesium deposition source comprises magnesium and a material with a lower vapor pressure, for example Cu. In another specific example, the source material for a co-deposition of magnesium and fullerene comprises a Cu—Mg compound mixed with fullerenes, for example, as a Cu—Mg fulleride compound. It will be appreciated that other low vapor pressure materials may be provided in the source.

Figure 10:
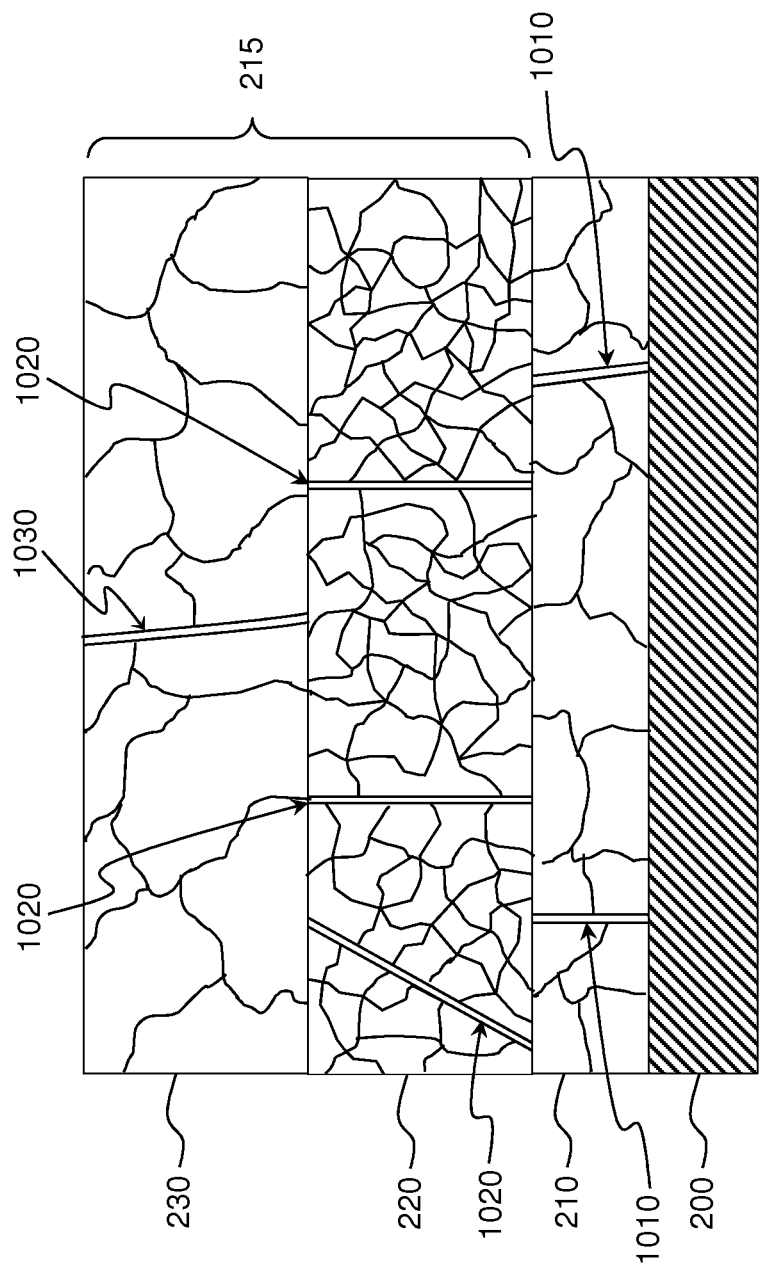
FIG. 10 is a diagram illustrating the barrier coating according to one embodiment.

Various aspects of the barrier coating 215 will now be explained with reference to FIG. 10. In FIG. 10, a barrier coating 215 comprising a first portion 220 and a second portion 230 is illustrated as being disposed on the surface of the electrode 210. The electrode 210 is disposed on the surface of the substrate 200. Particularly in cases wherein the electrode 210 and the barrier coating 215 are formed of crystalline metal having non-cubic crystalline structures, various portions of the barrier coating 215 and the electrode 210 may contain voids which allow passage of gases, such as oxygen or water vapor which may be present in the air. For example, such voids may be present at grain boundaries formed between adjacent crystalline grains of the material used to form the barrier coating 215 and the electrode 210. In FIG. 10, first voids 1010 are illustrated as being formed within the electrode 210, second voids 1020 are illustrated as being formed within the first portion 220, and a third void 1030 is illustrated as being formed within the second portion.

It is postulated that, particularly in cases where a relatively thick metallic coating is formed using metals having a hexagonal close packed (HCP) crystalline structure, a densely packed coating cannot readily be formed. Examples of such metals include magnesium, cadmium, and zinc. Specifically, it has been observed that, when a relatively thick magnesium coating of greater than about 1 µm is formed using substantially pure magnesium, the magnesium coating contains a relatively high density of microscopic voids which are larger than several hundred nanometers in size. It is noted that, in contrast, when metallic coatings are formed using metals having cubic crystalline structures such as, for example, aluminum or silver, significantly less microscopic voids are detected in such coatings compared to magnesium coatings.

It has now been found that, by providing a portion containing fullerene within the barrier coating 215 containing non-cubic crystalline metals, the average size as well as the density of voids present in such portion of the coating may be substantially reduced, compared to when a similar coating is formed without fullerene.

It is further postulated that, by disposing a portion comprising a mixture of fullerene and a metal between adjacent portions containing the metal, the growth mode of the metal contained is disrupted or interrupted. Specifically, by disrupting or interrupting the growth mode of the metal, the likelihood of a metallic coating portion having a different microstructure than the underlying metallic coating portion is increased.

It is postulated that the disruption of the growth mode of the metal may enhance the likelihood of the voids disposed in one portion of the coating from becoming misaligned or displaced with respect to the voids disposed in another adjacent portion of the coating, thus creating a tortuous path for any gases passing through the voids. It is postulated that, in this way, the likelihood of the coating inhibiting the gas from reaching the substrate 200 is increased. In other words, with reference to FIG. 10, the likelihood of any voids extending through the entire thickness of the barrier coating 215 and the cathode 210 may be reduced by disposing a first portion 220 comprising fullerene and a metal between the cathode 210 and the second portion 230.

It has been observed that certain metals may act as a desiccant. Accordingly, the second portion 230 may comprise a metal which acts as a getterer or desiccant to inhibit the passage of oxygen and/or water vapor therethrough. It is further postulated that the first portion 220 comprising the metal and fullerene may also act as a desiccant, which reacts with any oxygen and/or water vapor transmitted through the second portion 230 to inhibit such oxygen and/or water vapor from being further transmitted towards the electrode 210 and the substrate 200.

It has now been found that, by providing a barrier coating having a portion with smaller average grain size than adjacent portions of the coating, the overall barrier performance of the coating may be enhanced. With reference to FIG. 10 for example, the electrode 210 may exhibit a first average grain size, the first portion 220 may exhibit a second average grain size, and the second portion 230 may exhibit a third average grain size. It has now been found that the first portion 220 comprising a metal and fullerene may exhibit a smaller average grain size compared to the second portion 230, which, in at least some embodiments, consists essentially of a metal. That is, the second average grain size may be less than the third average grain size. In embodiments wherein the electrode 210 consists essentially of a metal, the second average grain size may also be less than the first average grain size. In some embodiments wherein the electrode 210 comprises a mixture of a metal and fullerene, the first average grain size may depend on a number of factors, such as, for example, the average concentration of fullerene in the electrode 210. Accordingly, in embodiments wherein the electrode 210 comprises fullerene and a metal, and the electrode 210 may be provided with a lower concentration of fullerene than the first portion 220, such that the first average grain size may be greater than the second average grain size, but less than the third average grain size.

In some cases, it may be particularly be advantageous to provide a barrier coating containing a plurality of first portions having a second average grain size, and a plurality of second portions having a third average grain size, wherein the first portion and the second portion are alternately arranged or stacked on top of one another. As explained above, the second average grain size may be less than the third average grain size, and thus such structure may form a barrier coating having enhanced barrier performance.

For example, in cases where the electrode 210 consists essentially of a metal such as for example magnesium, the average grain size of the electrode 210 may be greater than about 60 nm, greater than about 70 nm, greater than about 80 nm, greater than about 100 nm, greater than about 150 nm, greater than about 200 nm, greater than about 300 nm, greater than about 500 nm, or greater than about 1 µm. In some cases where the electrode 210 comprises fullerene such as for example $C_{60}$, and a metal such as for example magnesium, the average grain size of the electrode 210 may, for example, be less than about 100 nm, less than about 80 nm, less than about 70 nm, less than about 60 nm, or less than about 50 nm.

The average grain size of the first portion 220 may, for example, be less than about 50 nm, less than about 45 nm, less than about 40 nm, less than about 35 nm, less than about 30 nm, or less than about 25 nm. For example, the average grain size of the first portion 220 may, for example, be between about 20 to 50 nm, between about 25 to 40 nm, or between about 25 to 35 nm.

The average grain size of the second portion 230 may, for example, be greater than about 60 nm, greater than about 70 nm, greater than about 80 nm, greater than about 100 nm, greater than about 150 nm, greater than about 200 nm, greater than about 300 nm, greater than about 500 nm, or greater than about 1 µm.

Accordingly, in some embodiments, the average grain size of the second portion 230 may be greater than about 2 times, greater than about 3 times, greater than about 5 times, greater than about 10 times, greater than about 20 times, greater than about 30 times, or greater than about 50 times the average grain size of the first portion 220.

It is postulated that, by increasing the average compactness of portions of the barrier coating, the permeability of the barrier coating may be decreased. It has now been observed that an OLED device provided with a barrier coating including portion(s) having higher average compactness than other portion(s) exhibit enhanced environmental stability compared to an OLED device provided with a coating which does not include such portion. It has also now been found that, the environmental stability of an OLED device may be further enhanced by providing a barrier coating including two or more, three or more, or four or more portions having higher average compactness than other portions. For further clarity, the term "average compactness" as used herein would be understood to refer to a measure of how closely the materials forming the coating or portions thereof are compacted together. Accordingly, the average compactness would generally indicate the degree to which any voids may be present within the coating or portions thereof. Generally, a coating with a relatively high average compactness would include less voids (measured, for example, by total volume of all voids contained in such coating) than a coating with a relatively low average compactness. In another example, a portion of a coating having a higher fraction of the volume consisting of voids would generally exhibit a lower average compactness than another portion of the coating having a lower fraction of the volume consisting of voids.

In some cases, it has been observed that the average grain size generally correlates with the average compactness. Specifically, it has been observed that a portion of a coating having lower average grain size generally exhibits higher compactness than another portion of the coating having higher average grain size which generally exhibits lower compactness.

It is also postulated that, by increasing the average density of portions of the barrier coating, the barrier performance of the barrier coating may be increased. It has now been observed that an OLED device provided with a barrier coating including portion(s) having higher average density than other portion(s) exhibit enhanced environmental stability compared to an OLED device provided with a coating which does not include such portion. It has also now been found that, the environmental stability of an OLED device may be further enhanced by providing a barrier coating including two or more, three or more, or four or more portions having higher average density than other portions. For further clarity, the term "density" as used herein would be understood to refer to a measure of mass per unit volume.

It has now been observed that, somewhat surprisingly, a coating formed by a mixture of a metal and fullerene exhibits higher average density compared to a coating formed substantially of the metal at least in some cases. For example, it has been observed that a coating formed by a mixture of magnesium and $C_{60}$ with 10 vol. % $C_{60}$ concentration exhibits a higher average density compared to a coating formed by substantially pure magnesium, despite magnesium having a bulk density of about 1.738 $g/cm^3$, which is greater than the bulk density of $C_{60}$, which is about 1.65 $g/cm^3$.

For example, in embodiments wherein the first portion 220 comprises a mixture of fullerene and a metal and wherein the second portion 230 comprises the metal, the average density of the first portion may be greater than about 1.1 times, greater than about 1.2 times, greater than about 1.3 times, or greater than about 1.5 times the average density of the second portion.

In some embodiments, fullerene may be disposed at the interface between the substrate 200 and the electrode 210, the interface between the electrode 210 and the first portion 220, and/or the interface between the first portion 220 and the second portion 230. It is postulated that disposing fullerene at these interfaces may further enhance the barrier performance of the barrier coating 215 due to the fullerene acting as nucleation centers at these interfaces, thus causing changes to the microstructure or the grain structure of the coating or portion deposited over the fullerene treated surfaces. Specifically, it is postulated that disposing fullerene at these interfaces causes subsequent portion of the coating deposited on the fullerene-treated surface to undergo a nucleation step, followed by growth. In this way, the microstructure of the subsequent portion may substantially differ from that of the underlying portion.

In some embodiments, the barrier coating 215 may be electrically conductive. Accordingly, the first portion 220 and the second portion 230 may each be electrically conductive. For example, the barrier coating 215 may form a part of an electrode, for example a cathode of an opto-electronic device.

As used herein, a material, a layer, and/or a coating may be considered to be electrically conductive if it readily allows electrical current to flow therethrough under the general operating condition of the device (e.g. at room temperature). Accordingly, an electrically conductive material may generally exhibit relatively low resistivity.

In some embodiments, the barrier coating 215 may be thermally conductive. Accordingly, the first portion 220 and the second portion 230 may each be thermally conductive. It may be particularly advantageous for the barrier coating 215 to be thermally conductive in cases where the barrier coating 215 is provided as part of the cathode of a relatively large opto-electronic device. In such device, the barrier coating 215 may assist in dissipating the heat accumulated and/or outputted by the device.

In some embodiments, various portions of the barrier coating 215 and the electrode 210 may be deposited using the same evaporation source(s). For example, one, two, or three or more evaporation sources may be used to deposit the electrode 210, the first portion 220, and/or the second portion 230. In some embodiments, the barrier coating 215 may be deposited using a metal source and a fullerene source. In such embodiments, for example, the deposition rate of the metal may remain substantially the same or constant throughout the formation of the barrier coating 215, while the deposition rate of fullerene may be varied accordingly to form various portions of the barrier coating 215 having the desired fullerene content.

For example, during the deposition of the electrode 210, the fullerene source may be turned off, or a shutter may be placed between the fullerene source and the target substrate to substantially inhibit fullerene from being deposited. Alternatively, both the metal source and the fullerene source may be actuated during the deposition of the electrode 210 to produce an electrode 210 comprising fullerene and the metal. In such embodiments, the sources may be configured such that the deposition rate of the metal is greater than about 5 times, greater than about 10 times, greater than about 15 times, greater than about 20 times, greater than about 30 times, greater than about 50 times, or greater than about 100 times the deposition rate of fullerene for example.

During the deposition of the first portion 220, at least in some cases, both the metal source and the fullerene source may be actuated to produce the electrode 210 comprising a mixture of fullerene and the metal. In such embodiments, the sources may be configured such that the deposition rate of the metal is greater than about 3 times, greater than about 5 times, greater than about 7 times, greater than about 9 times, greater than about 12 times, greater than about 15 times, or greater than about 19 times the deposition rate of fullerene for example. More specifically, the deposition rate of the metal may be, for example, between about 3 to 20 times, 5 to 20 times, or 7 to 20 times the deposition rate of fullerene.

It has now been found that, at least in some cases, including an organic material in the barrier coating may not substantially improve the barrier performance of the barrier coating when compared to a similar barrier coating that does not include the organic material. It has also now been found that, somewhat surprisingly, inclusion of the organic material may adversely impact the barrier performance at least in some cases. Accordingly, in some embodiments, the barrier coating may consist essentially of metal and fullerene.

Figure 11:
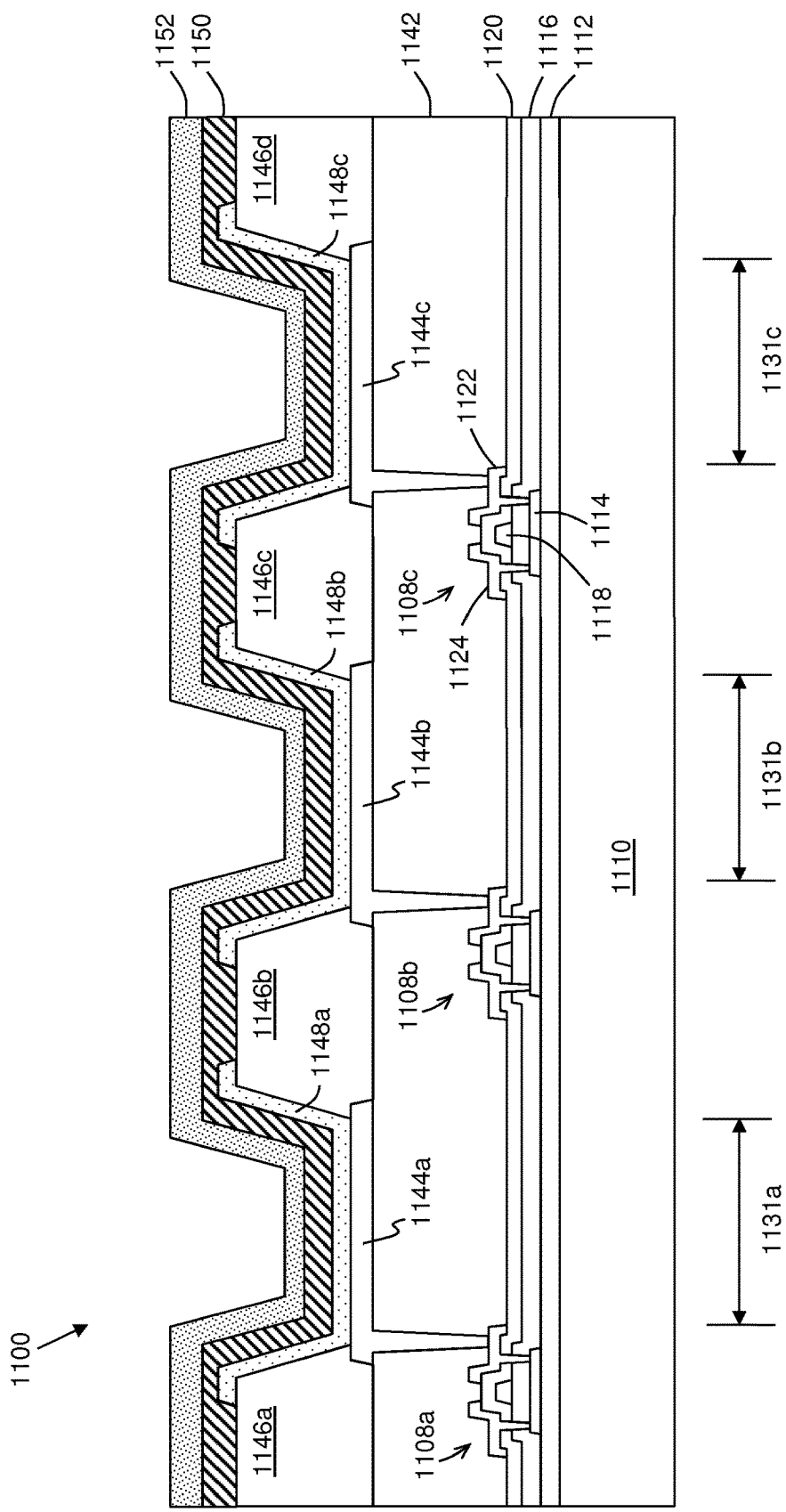
FIG. 11 is a diagram of an active-matrix OLED (AMOLED) including a barrier coating according to one embodiment.

FIG. 11 is a cross-sectional schematic diagram illustrating a portion of an active-matrix OLED (AMOLED) device 1100 according to one embodiment. The AMOLED device 1100 includes a first emissive region 1131a, a second emissive region 1131b, and a third emissive region 1131c. The first emissive region 1131a, the second emissive region 1131b, and the third emissive region 1131c may be subpixels of the AMOLED device 1100.

The device 1100 includes a base substrate 1110, and a buffer layer 1112 deposited over a surface of the base substrate 1110. A plurality of thin-film transistors (TFTs) 1108a, 1108b, 1108c is then formed over the buffer layer 1112. Specifically with reference to the TFT 1108c, a semiconductor active area 1114 is formed over a portion of the buffer layer 1112, and a gate insulating layer 1116 is deposited to substantially cover the semiconductor active area 1114. Next, a gate electrode 1118 is formed on top of the gate insulating layer 1116, and an interlayer insulating layer 1120 is deposited. A source electrode 1124 and a drain electrode 1122 are formed such that they extend through openings formed through the interlayer insulating layer 1120 and the gate insulating layer 1116 to be in contact with the semiconductor active layer 1114. An insulating layer 1142 is then formed over the TFTs 1108a, 1108b, 1108c. A first electrode 1144a, 1144b, 1144c is then formed in each of the first emissive region 1131a, the second emissive region 1131b, and the third emissive region 1131c, respectively, over a portion of the insulating layer 1142. As illustrated in FIG. 11, each of the first electrode 1144a, 1144b, 1144c extends through an opening of the insulating layer 1142 such that it is in electrical communication with the drain electrode 1122 of the respective TFTs 1108a, 1108b, 1108c. Pixel definition layers (PDLs) 1146a, 1146b, 1146c, 1146d are then formed to cover at least a portion of the first electrodes 1144a, 1144b, 1144c including the outer edges of each electrode. For example, the PDLs 1146a, 1146b, 1146c, 1146d may include an insulating organic or inorganic material. An organic layer 1148a, 1148b, 1148c is then deposited over the respective first electrode 1144a, 1144b, 1144c particularly in regions between neighboring PDLs 1146a, 1146b, 1146c, 1146d. A second electrode 1150 is deposited to substantially cover both the organic layers 1148a, 1148b, 1148c and the PDLs 1146a, 1146b, 1146c, 1146d. For example, the second electrode 1150 may form a common cathode of the device 1100. A barrier coating 1152 is then deposited over the second electrode 1150. At least a portion of the barrier coating 1152 may be electrically conductive. At least a portion of the barrier coating 1152 may also be reflective to allow the light emitted from the emissive regions 1131a, 1131b, 1131c of the device 1100 to be emitted or reflected in a direction towards the base substrate 1110. In such embodiment, the device 1100 may be a bottom-emission AMOLED device.

The barrier coating 1152 may comprise a first portion and a second portion. Various embodiments of the barrier coating, including the first portion and the second portion have been described above and would be understood to be applicable for the barrier coating 1152 illustrated in FIG. 11.

Figure 12:
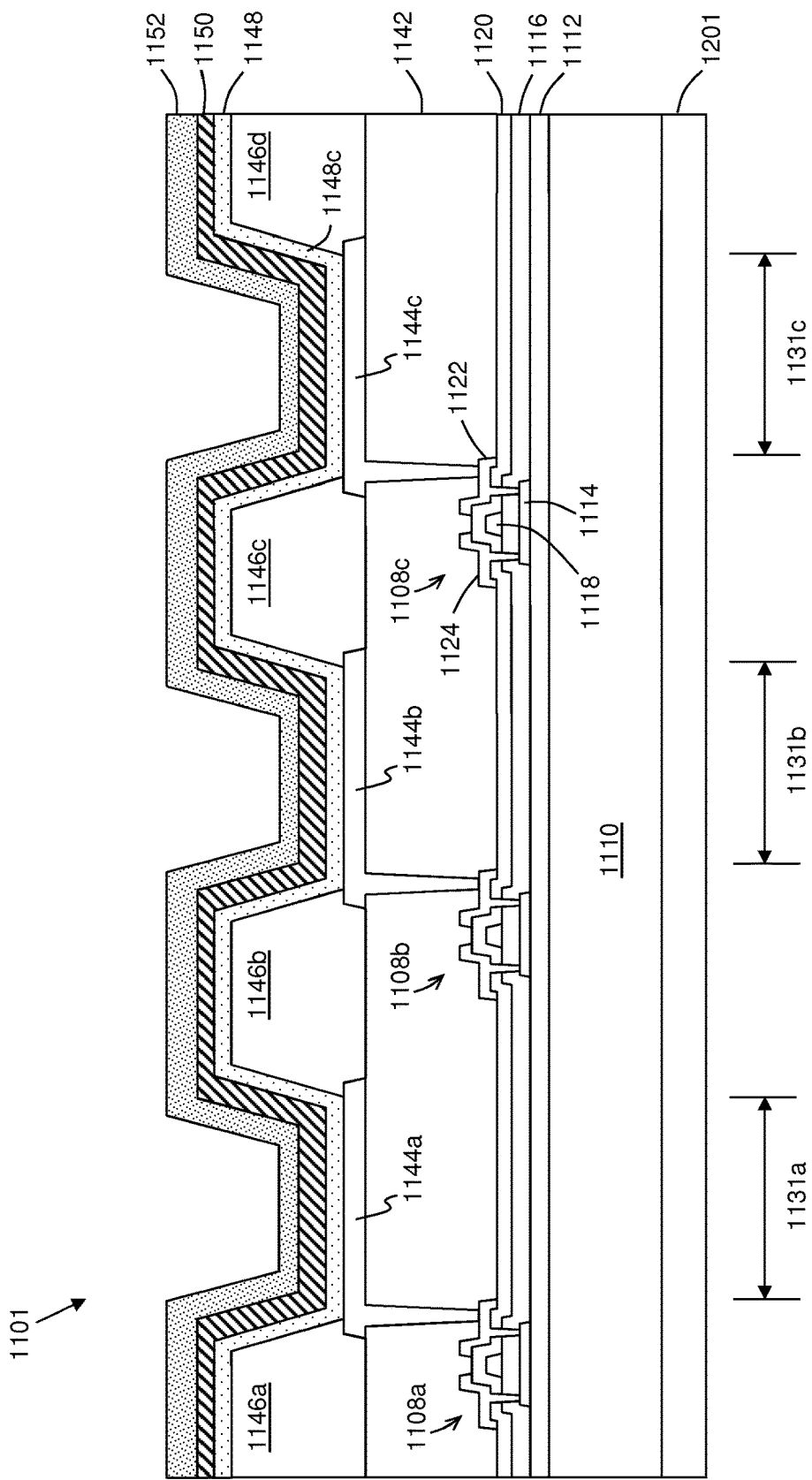
FIG. 12 is a diagram of an AMOLED including a barrier coating according to another embodiment.

FIG. 12 illustrates an AMOLED device 1101 according to another embodiment, wherein the device 1101 comprises a common organic layer 1148 disposed over the surfaces of the first electrodes 1144a, 1144b, 1144c, and the PDLs 1146a, 1146b, 1146c, 1146d. The device 1101 may be configured to emit light having a substantially white emission spectrum from the first emissive region 1131a, the second emissive region 1131b, and the third emissive region 1131c. A color filter 1201 may be provided on the substrate 1110 to then convert the white emission spectrum into the desired emission spectrum of each emissive region or subpixel 1131a, 1131b, 1131c. For example, the color filter 1201 may be configured to convert the light emitted by the first emissive region 1131a into a blue light, the light emitted by the second emissive region 1131b into a green light, and the light emitted by the third emissive region 1131c into a red light. However, it will be appreciated that the color filter 1201 may convert the light emitted by each of the emissive regions into any color or spectrum.

FIG. 13 illustrates an embodiment wherein an opto-electronic device 1301 is provided with an electrode 210 and a barrier coating 1315. Specifically, the barrier coating 1315 comprises two first portions 1320a, 1320b and two second portions 1330a, 1330b. Various embodiments of the barrier coating, including composition of the first portion and the second portion have been described above, and accordingly, such description would be understood to be applicable for each of the respective portions of the barrier coating 1315 illustrated in FIG. 13. In the embodiment of FIG. 13, the first portions 1320a, 1320b and the second portions 1330a, 1330b are arranged alternately, such that a first portion 1320a is disposed over the electrode 210, and a second portion 1330a is disposed over the first portion 1320a. The first portion 1320b is disposed over the second portion 1330a, and the second portion 1330b is disposed over the first portion 1320b. In this way, neighboring second portions 1330a, 1330b are intercalated by the first portion 1320b.

FIG. 14 illustrates an embodiment of an opto-electronic device 1401 wherein the device 1401 comprises an electrode 210 and a barrier coating 1415. Specifically, the barrier coating 1415 comprises three first portions 1420a, 1420b, 1420c, and three second portions 1430a, 1430b, 1430c. Various embodiments of the barrier coating, including the composition of the first portion and the second portion have been described above, and accordingly, such description would be understood to be applicable for each of the respective portions of the barrier coating 1415 illustrated in FIG. 14. In the embodiment of FIG. 13, the first portions 1420a, 1420b, 1420c and the second portions 1430a, 1430b, 1430c are arranged alternately and stacked on top of one another.

In some embodiments wherein additional first and second portions are provided, the additional portions of the barrier coating may be formed integrally or continuously with one another, and with the first portion and the second portion.

Furthermore, the electrode 210 and the barrier coating may be formed integrally or continuously with one another.

While embodiments wherein two or three additional barrier coating portions are disposed on the substrate 200 have been described and illustrated in FIGS. 13 and 14, it will be appreciated that any number of barrier coating portions may be provided. For example, 4 or more, 5 or more, or 6 or more barrier coating portions may be provided in a device. In some embodiments, the device or substrate may be provided with a plurality of barrier coatings, wherein the plurality of barrier coatings are disposed on top of one another or are vertically stacked.

Figure 15A:
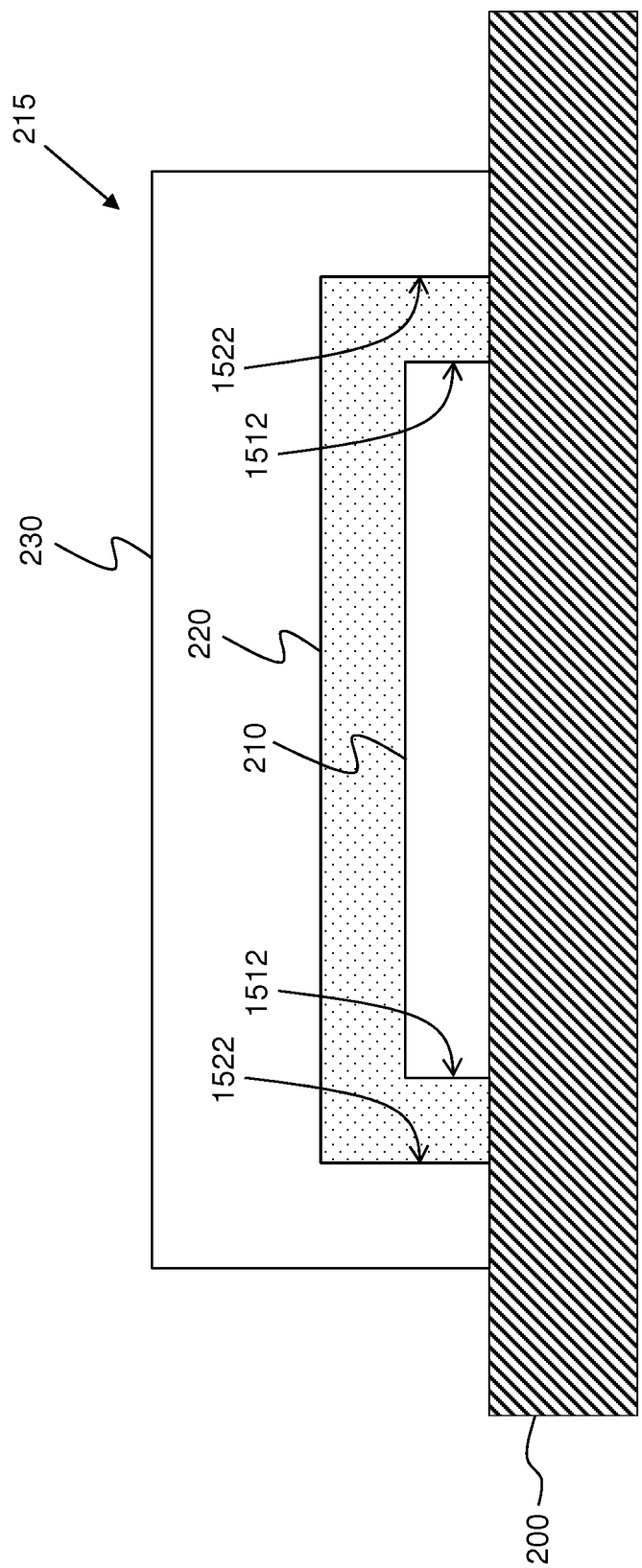
FIG. 15A is a diagram of a barrier coating according to one embodiment.

FIG. 15A illustrates one embodiment of a barrier coating 215 comprising an electrode 210, a first portion 220, and a second portion 230. In the embodiment of FIG. 15, the perimeter or edges 1512 of the electrode 210 are illustrated as being coated or covered by the first portion 220. The perimeter or edges 1522 of the first portion 220 are also illustrated as being coated or covered by the second portion 230. Such embodiment may be particularly favorable for inhibiting the lateral permeation or edge ingress of gases, such as air and water vapor towards the electrode 210 and the portion of the substrate 200 coated by the electrode 210.

Figure 15B:
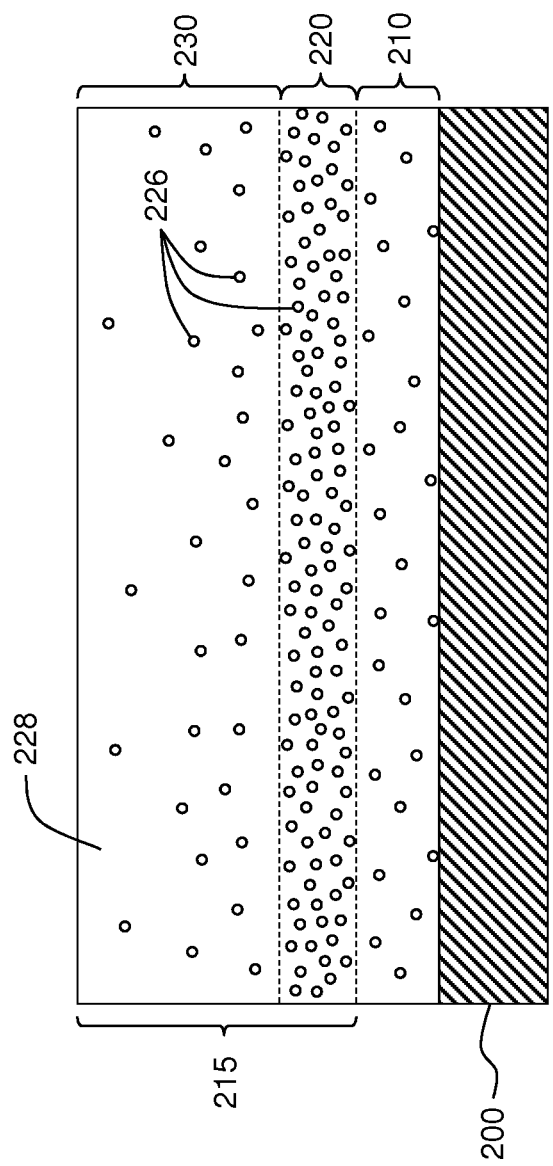
FIG. 15B is a diagram of a barrier coating formed integrally with the electrode according to one embodiment.

FIG. 15B illustrates one embodiment, wherein the electrode 210, the first portion 220, and the second portion 230 are formed integrally over the substrate 200 and various portions of the electrode 210 and the barrier coating 215 are provided with different concentrations of fullerene 226. In the embodiment of FIG. 15B, the electrode 210, the first portion 220, and the second portion 230 may each comprise a mixture of a metal 228 and fullerene 226. In forming the electrode 210 and the barrier coating 215, the concentration of fullerene 226 may be varied, for example, by modulating the relative deposition rate of fullerene with respect to the deposition rate of the metal. In this way, the first portion 220 may be provided with a higher concentration of fullerene 226 than the electrode 210 or the second portion 230. While not specifically illustrated, it will be appreciated that in some embodiments, the electrode 210 and/or the second portion 230 may be substantially be free of, or may not contain, fullerene 226.

Figure 15C:
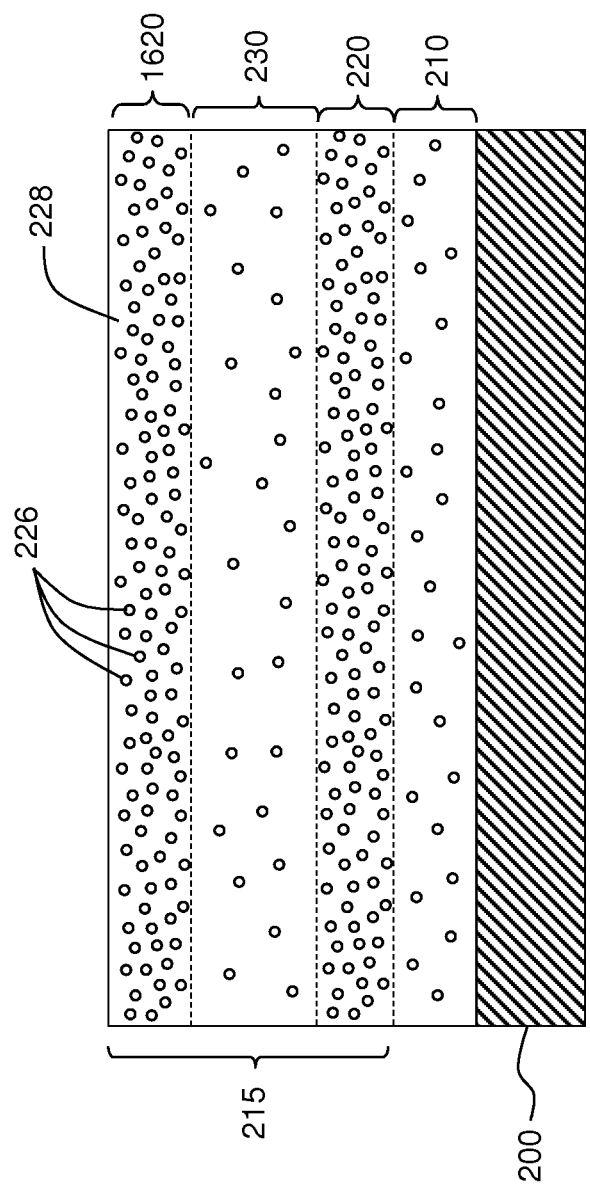
FIG. 15C is a diagram of a barrier coating formed integrally with the electrode according to another embodiment.

FIG. 15C illustrates a further embodiment of FIG. 15B. In FIG. 15C, an additional first portion 1620 comprising a mixture of fullerene 226 and the metal 228 is provided over the second portion 230 of the barrier coating 215. The additional first portion 1620 may be formed integrally or continuously with the first portion 220 and the second portion 230, for example, by continuing to co-deposit fullerene and metal in the manner described above. The concentration of fullerene 226 in the additional first portion 1620 may be comparable to the concentration of fullerene 226 in the first portion 220. Alternatively, the concentration of fullerene 226 in the additional first portion 1620 may be less than, or greater than, the concentration of fullerene 226 in the first portion 220. At least in some embodiments, the concentration of fullerene 226 in the additional first portion 1620 is greater than the concentration of fullerene 226 in the portion(s) adjacent to the additional first portion 1620 (e.g. the second portion 230).

Figure 15D:
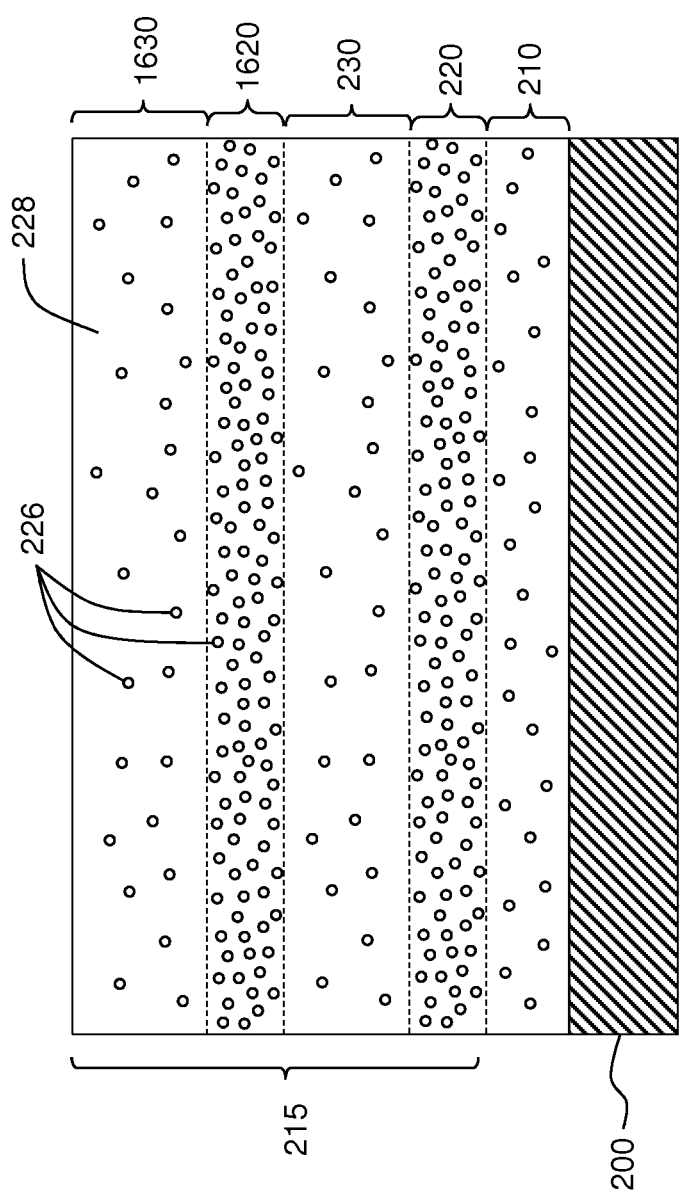
FIG. 15D is a diagram of a barrier coating formed integrally with the electrode according to yet another embodiment.

FIG. 15D illustrates a further embodiment of FIG. 15C, wherein an additional second portion 1630 is disposed over the additional first portion 1620 to form the barrier coating 215. The additional second portion 1630 may be described in substantially the same manner as the second portion 230, and therefore the description of such is omitted for sake of simplicity.

It will be appreciated that, in addition to the coatings and portions illustrated in FIG. 15D, further coatings and portions may be disposed on top of, or in between various portions of the barrier coating 215 and the additional barrier coating portions 1620, 1630.

The electrode 210 and the barrier coating 215 may be formed, for example, by continuously depositing the metal 228 while modulating the relatively deposition rate of fullerene to obtain the desired concentration of fullerene in various portions of the coatings. For example, the relative deposition rate of fullerene may be modulated by decreasing the evaporation rate of fullerene and/or by blocking the fullerene vapor flux during the deposition process using a shutter to inhibit at least a portion of the fullerene vapor flux from being incident on the deposition target. The relative deposition rate of fullerene may be varied in a continuous or undulating manner, or may be varied in a discontinuous manner. For example, the deposition of fullerene may be gradually decreased and increased during the formation of the coating or the deposition of fullerene may be abruptly halted and commenced during the formation of the coating.

It will be appreciated that, as used herein, fullerene will be understood to be any carbon-based molecule in the form of a hollow sphere, ellipsoid, tube, or any other three dimensional shapes. More specifically, fullerene will be understood to include carbon-based molecules whose atoms are arranged in closed hollow spheres, as well as carbon-based molecules whose atoms form elongated hollow tubular structures. As such, examples of fullerene include, but are not limited to, buckminsterfullerene (i.e. $C_{60}$), $C_{70}$, $C_{76}$, $C_{84}$, multi-wall and single-wall carbon nanotubes (CNTs), including conducting and semiconducting CNTs. It will also be understood that fullerene may also be a combination or mixture of several different types of fullerenes. Furthermore, it will be appreciated that fullerene derivatives such as functionalized fullerenes, as well as doped fullerenes, may also be used. As such, fullerene molecules may comprise various functional groups and/or non-carbon atoms. For example, phenyl-C61-butyric acid methyl ester (PCBM) may be used as the fullerene.

It will also be appreciated that the magnesium described herein may be substantially pure magnesium or a magnesium alloy. It will be appreciated that the purity of a substantially pure magnesium may be above 99%, 99.9%, or higher. A magnesium alloy may comprise various magnesium alloys are known in the art.

EXAMPLES

Aspects of the invention will now be illustrated with reference to the following examples, which are not intended to limit the scope of the invention in any way.

An identical device structure was used to fabricate all of the example OLED devices described herein. Specifically, the general device structure used in all of the example OLED devices are as follows: anode/hole injection layer/hole transport layer/emitter layer/electron transport layer/electron injection layer/conductive coating. In various evaluation samples, one or more additional coatings or layers were deposited over the conductive coating to evaluate the barrier performance of the resulting barrier coating. All of the example OLED devices were then encapsulated and tested for environmental stability by being subjected to an accelerated aging condition of 85° C. and 85% relative humidity. The environmental stability was assessed by measuring the percentage of non-emissive area of each OLED sample at various times during the aging process. As is known, when an emissive region of an OLED is degraded due to contact with air and/or water, such region will no longer emit light. Accordingly, the environmental stability of an OLED sample may be assessed by detecting the percentage of the emissive region of the OLED which become non-emissive over time due to degradation.

In all of the examples described below, the magnesium used to form various coatings of the example OLED devices and portions thereof was substantially pure magnesium having a purity greater than about 99%. Similarly, the aluminum used to form various coatings of the example OLED devices and portions thereof was substantially pure aluminum having a purity greater than about 99%.

Example A

Device Sample 1 was fabricated in accordance with the general device structure described above. Specifically, the cathode was fabricated by depositing a 1 nm thick $C_{60}$ coating followed by a 500 nm thick magnesium coating.

Device Sample 2 was fabricated by depositing a 1 nm thick $C_{60}$ coating followed by a 2500 nm thick magnesium coating to form the cathode.

Figure 16:
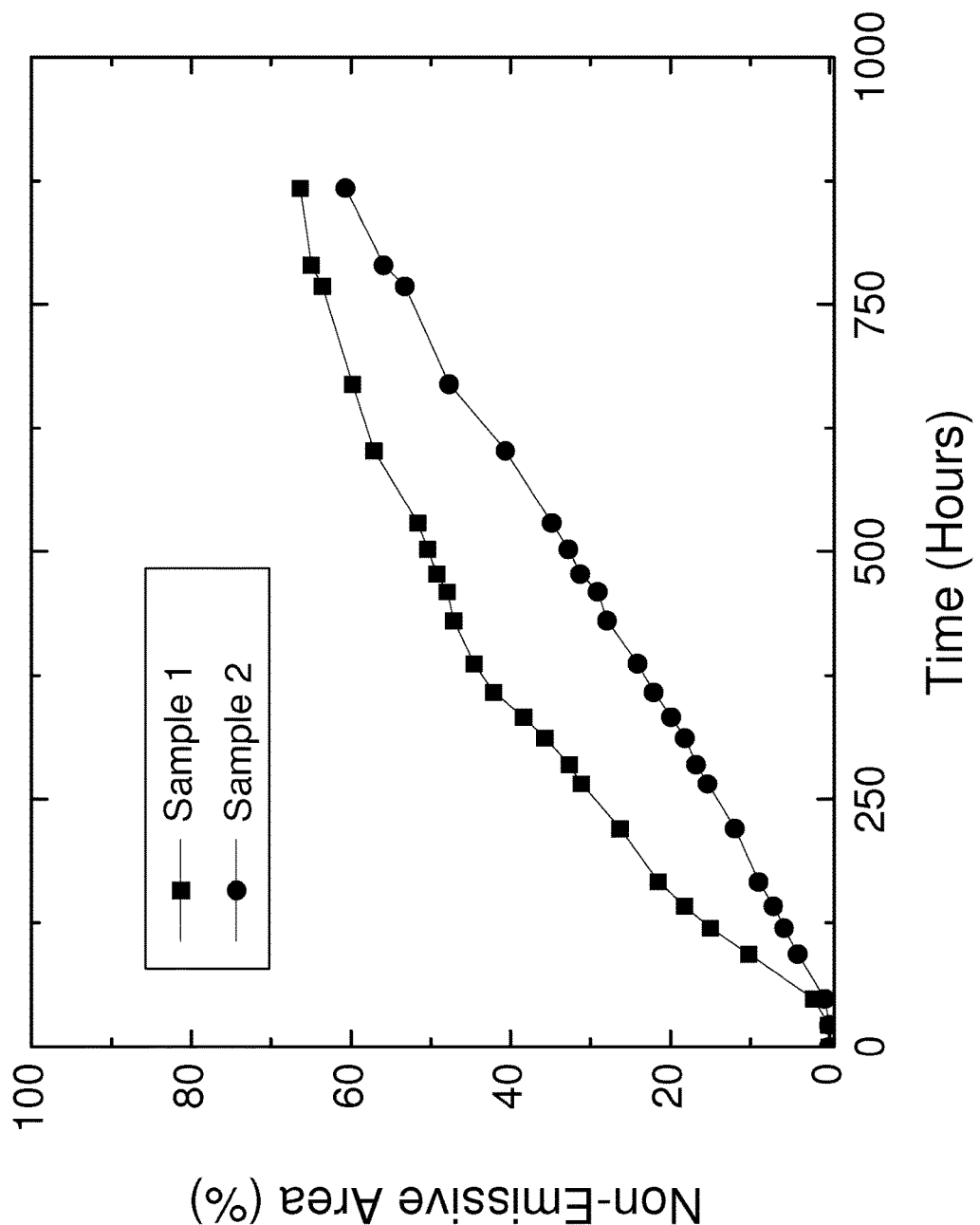
FIG. 16 is a plot of non-emissive area at various times during the aging process for samples of Example A.

FIG. 16 is a plot of percentage of non-emissive area vs. the time period during which the samples were subjected to the accelerated aging condition. As can be seen, while both Samples 1 and 2 showed significant degradation in the course of the aging process, Sample 2, which was provided with a thicker magnesium coating than Sample 1, degraded to a lesser extent based on the percentage of non-emissive area.

Example B

Sample 3 was fabricated according to the general device structure described above. Specifically, the conductive coating was formed by depositing a 1 nm thick coating of $C_{60}$ over the electron injection layer, followed by deposition of a 200 nm thick magnesium coating over the $C_{60}$ coating. Three sets of additional coatings were then successively deposited over the magnesium coating, one over another. Each set of additional coating was formed by depositing a 100 nm thick Mg:$C_{60}$ coating, followed by a 400 nm thick magnesium coating. The concentration of $C_{60}$ in each of the 100 nm thick Mg:$C_{60}$ coating was approximately 10% by volume.

Sample 4 was fabricated according to the general device structure described above. Specifically, the conductive coating was formed by depositing a 1 nm thick coating of $C_{60}$ over the electron injection layer, followed by deposition of a 200 nm thick magnesium coating over the $C_{60}$ coating. Three sets of additional coatings were then successively deposited over the magnesium coating, one over another. Each set of additional coating was formed by depositing a 10 nm thick 2,2',2"-(1,3,5-Benzinetriyl)-tris(1-phenyl-1-H-benzimidazole) (TPBi) coating, followed by a 1 nm thick $C_{60}$ coating, followed by a 500 nm thick magnesium coating.

Figure 17:
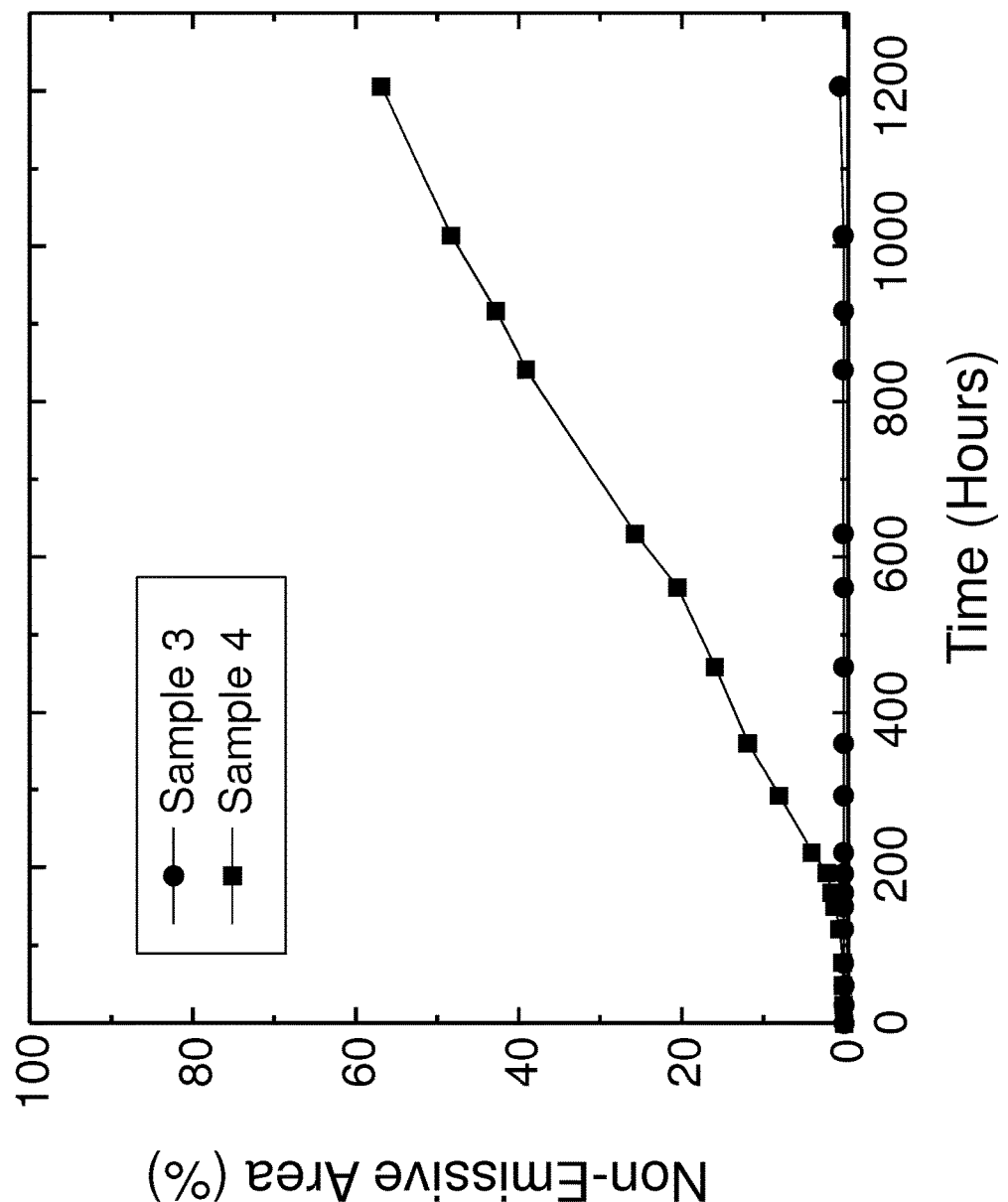
FIG. 17 is a plot of non-emissive area at various times during the aging process for samples of Example B.

FIG. 17 is a plot of percentage of non-emissive area vs. the time period during which the samples were subjected to the accelerated aging condition. As can be seen, Sample 3 performed significantly better than Sample 4, as there was no detectable change observed in the percentage of non-emissive area of Sample 3 even after 1200 hours of aging, whereas over 50% of the emissive area had degraded for Sample 4 after the same time period.

Example C

Sample 5 was fabricated according to the general device structure described above. Specifically, the conductive coating was formed by depositing a 1 nm thick coating of $C_{60}$ over the electron injection layer, followed by deposition of a 200 nm thick magnesium coating over the $C_{60}$ coating. Four sets of additional coatings were then successively deposited over the magnesium coating, one over another. Each set of additional coating was formed by depositing a 100 nm thick Mg:$C_{60}$ coating, followed by a 200 nm thick magnesium coating. The concentration of $C_{60}$ in each of the 100 nm thick Mg:$C_{60}$ coating was approximately 10% by volume.

Sample 6 was fabricated according to the general device structure described above. Specifically, the conductive coating was formed by depositing a 1 nm thick coating of $C_{60}$ over the electron injection layer, followed by deposition of a 200 nm thick magnesium coating over the $C_{60}$ coating. A 1200 nm thick Mg:$C_{60}$ coating was then deposited over the magnesium coating. The concentration of $C_{60}$ in the Mg:$C_{60}$ coating was approximately 10% by volume.

Figure 18:
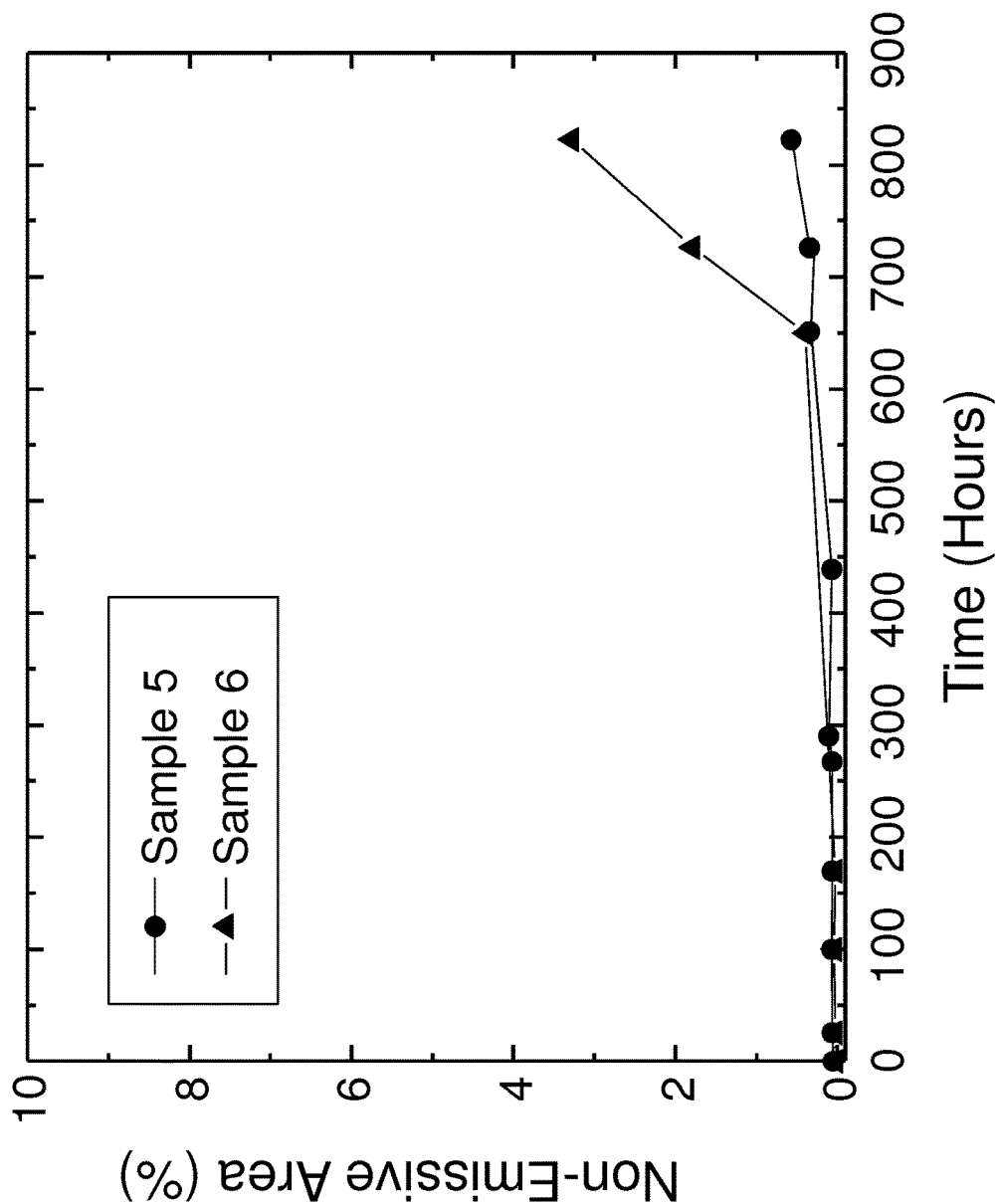
FIG. 18 is a plot of non-emissive area at various times during the aging process for samples of Example C.

FIG. 18 is a plot of percentage of non-emissive area vs. the time period during which the samples were subjected to the accelerated aging condition. As can be seen, both Samples 5 and 6 performed comparatively for about the first 650 hours of aging. However, Sample 5 performed better than Sample 6 after about 650 hours of aging. Specifically, while the percentage of non-emissive area gradually increased to over 3% after about 800 hours for Sample 6, there was relatively little change observed in the percentage of non-emissive area of Sample 5 after about 800 hours of aging.

Example D

Three evaluation samples were fabricated to assess the effects of varying the fullerene concentration in the Mg:$C_{60}$ coating.

Samples 7, 8, and 9 were all fabricated according to the general device structure described above. Specifically, for each sample, the conductive coating was formed by depositing a 1 nm thick coating of $C_{60}$ over the electron injection layer, followed by deposition of a 200 nm thick magnesium coating over the $C_{60}$ coating. Three sets of additional coatings were then successively deposited over the magnesium coating, for each sample. Each set of additional coating was formed by depositing a 100 nm thick Mg:$C_{60}$ coating, followed by a 300 nm thick magnesium coating. For Sample 7, the concentration of $C_{60}$ in each of the 100 nm thick Mg:$C_{60}$ coating was approximately 0.2% by volume. For Sample 8, the concentration of $C_{60}$ in each of the 100 nm thick Mg:$C_{60}$ coating was approximately 1% by volume. For Sample 9, the concentration of $C_{60}$ in each of the 100 nm thick Mg:$C_{60}$ coating was approximately 5% by volume.

Figure 19:
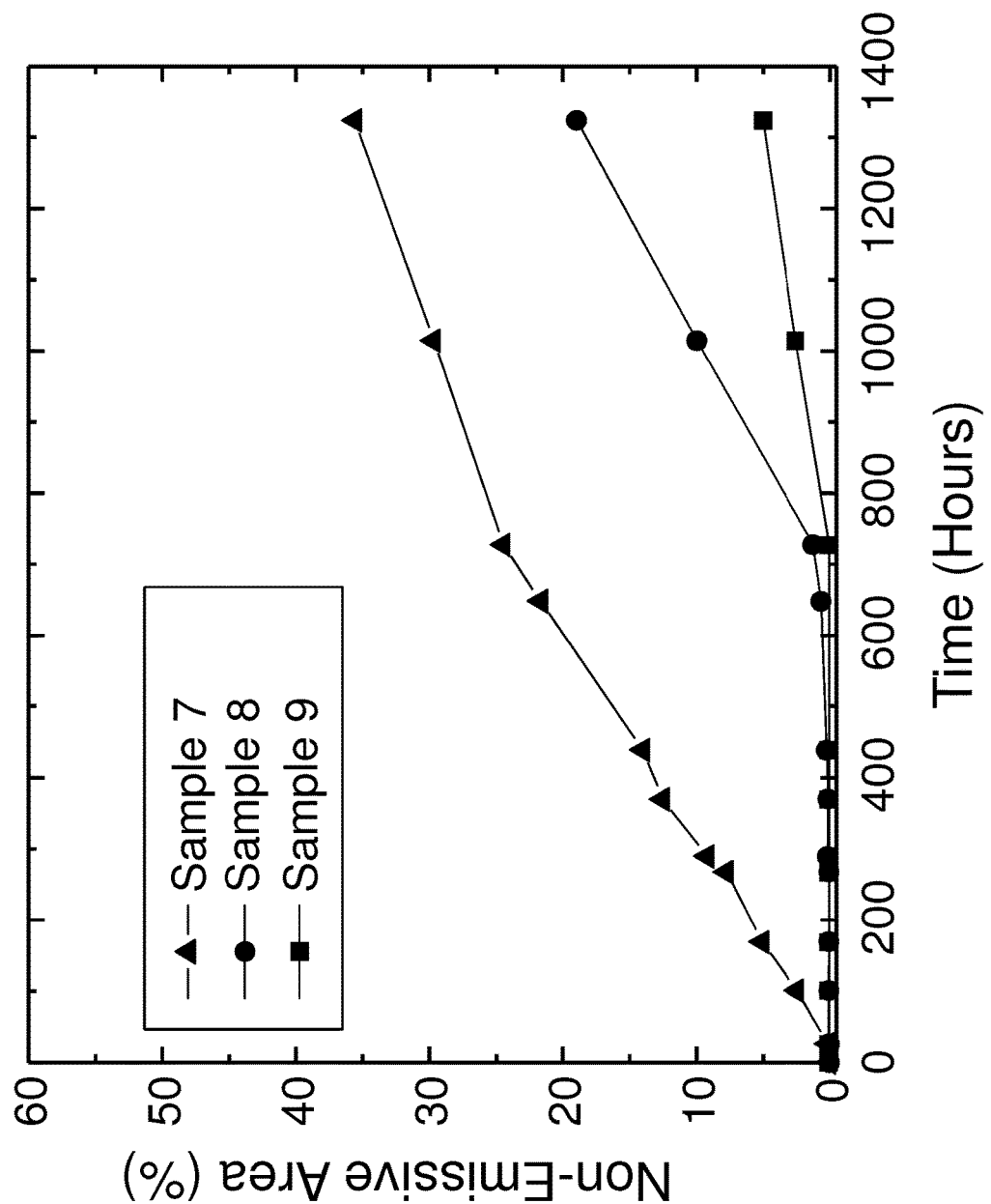
FIG. 19 is a plot of non-emissive area at various times during the aging process for samples of Example D.

FIG. 19 is a plot of percentage of non-emissive area vs. the time period during which the samples were subjected to the accelerated aging condition. Based on the results, Sample 7 performed significantly worse than Samples 8 or 9. In particular, while the percentage of non-emissive region did not substantially change during the first 600 hours of aging for Samples 8 or 9, the percentage of non-emissive region increased to about 20% after about 600 hours of aging for Sample 7. It was also observed that Sample 9 performed better than Sample 8, particularly after about 750 hours of aging. Specifically, while the percentage of non-emissive region increased to about 20 percent after about 1330 hours for Sample 8, the percentage of non-emissive region was about 5 percent after about 1330 hours for Sample 9.

Example E

Sample 10 was fabricated according to the general device structure described above. Specifically, the conductive coating was formed by depositing a 1 nm thick coating of $C_{60}$ over the electron injection layer, followed by deposition of a 100 nm thick magnesium coating over the $C_{60}$ coating. Four sets of additional coatings were then successively deposited over the conductive coating, one over another. Each set of additional coating was formed by depositing a 50 nm thick Mg:$C_{60}$ coating, followed by a 200 nm thick magnesium coating. The concentration of $C_{60}$ in each of the 50 nm thick Mg:$C_{60}$ coating was approximately 15% by volume.

Sample 11 was fabricated according to the general device structure described above. Specifically, the conductive coating was formed by depositing a 200 nm thick aluminum coating over the electron injection layer surface. Four sets of additional coatings were then successively deposited over the conductive coating, one over another. Each set of additional coating was formed by depositing a 50 nm thick Mg:$C_{60}$ coating, followed by a 200 nm thick magnesium coating. The concentration of $C_{60}$ in each of the 50 nm thick Mg:$C_{60}$ coating was approximately 15% by volume.

Sample 12 was fabricated by depositing a 200 nm thick aluminum coating to form the cathode.

Figure 20:
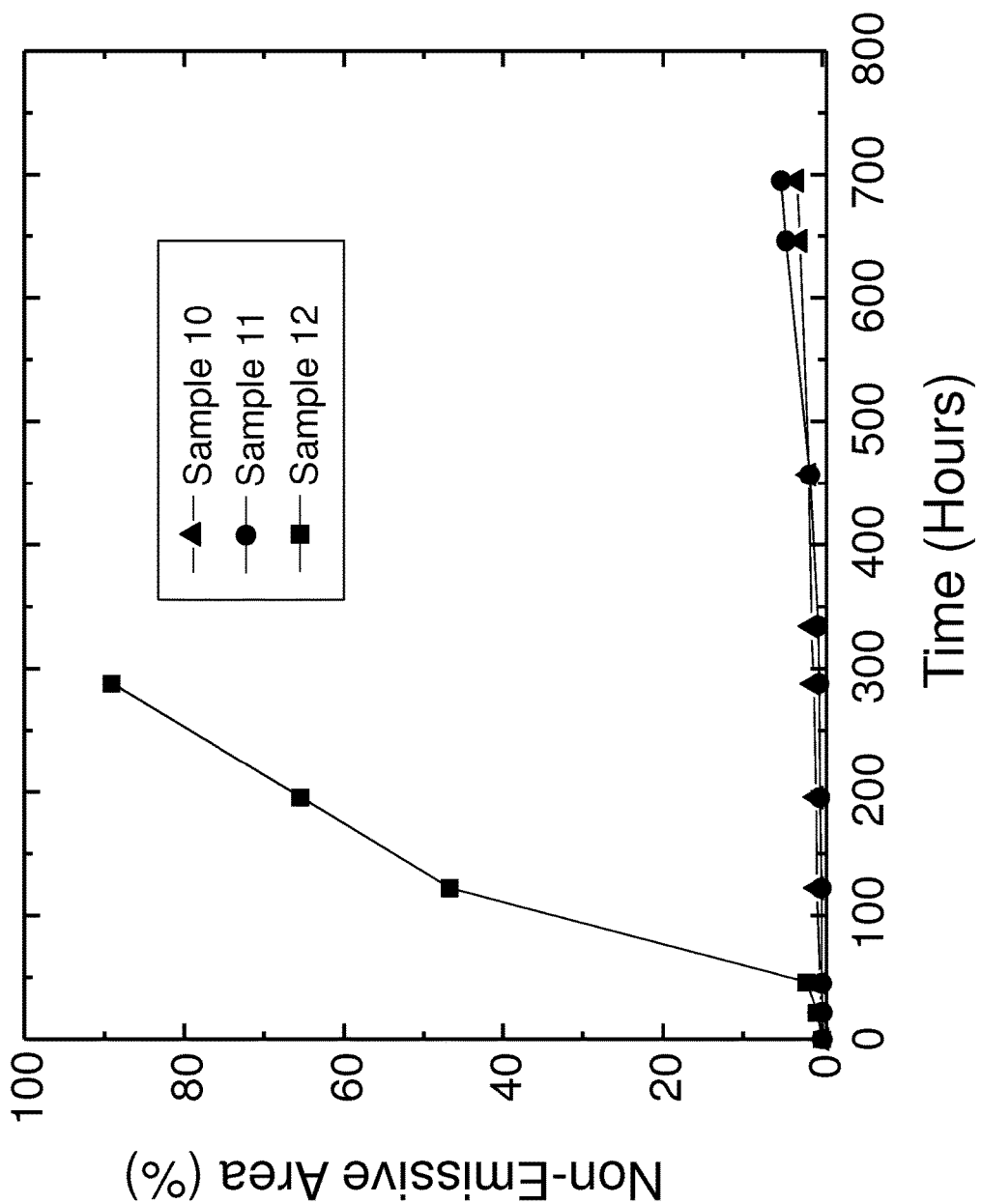
FIG. 20 is a plot of non-emissive area at various times during the aging process for samples of Example E.

FIG. 20 is a plot of percentage of non-emissive area vs. the time period during which the samples were subjected to the accelerated aging condition. Based on the results, Sample 12 performed significantly worse than Samples 10 or 11. In particular, while the percentage of non-emissive region did not substantially change during the first 300 hours of aging for Samples 10 or 11, the percentage of non-emissive region increased to about 90% after about 300 hours of aging for Sample 12.

Example F

A number of samples were prepared and analyzed using a scanning electron microscopy (SEM) to determine the morphology of various portions of the samples.

The first sample was prepared by depositing the following layers or coatings, in the order indicated, on the surface of a silicon substrate: an approximately 2 μm thick magnesium coating; an approximately 400 nm thick Mg:$C_{60}$ coating with 15 vol. % $C_{60}$; and an approximately 2 μm thick magnesium coating.

Figure 21:
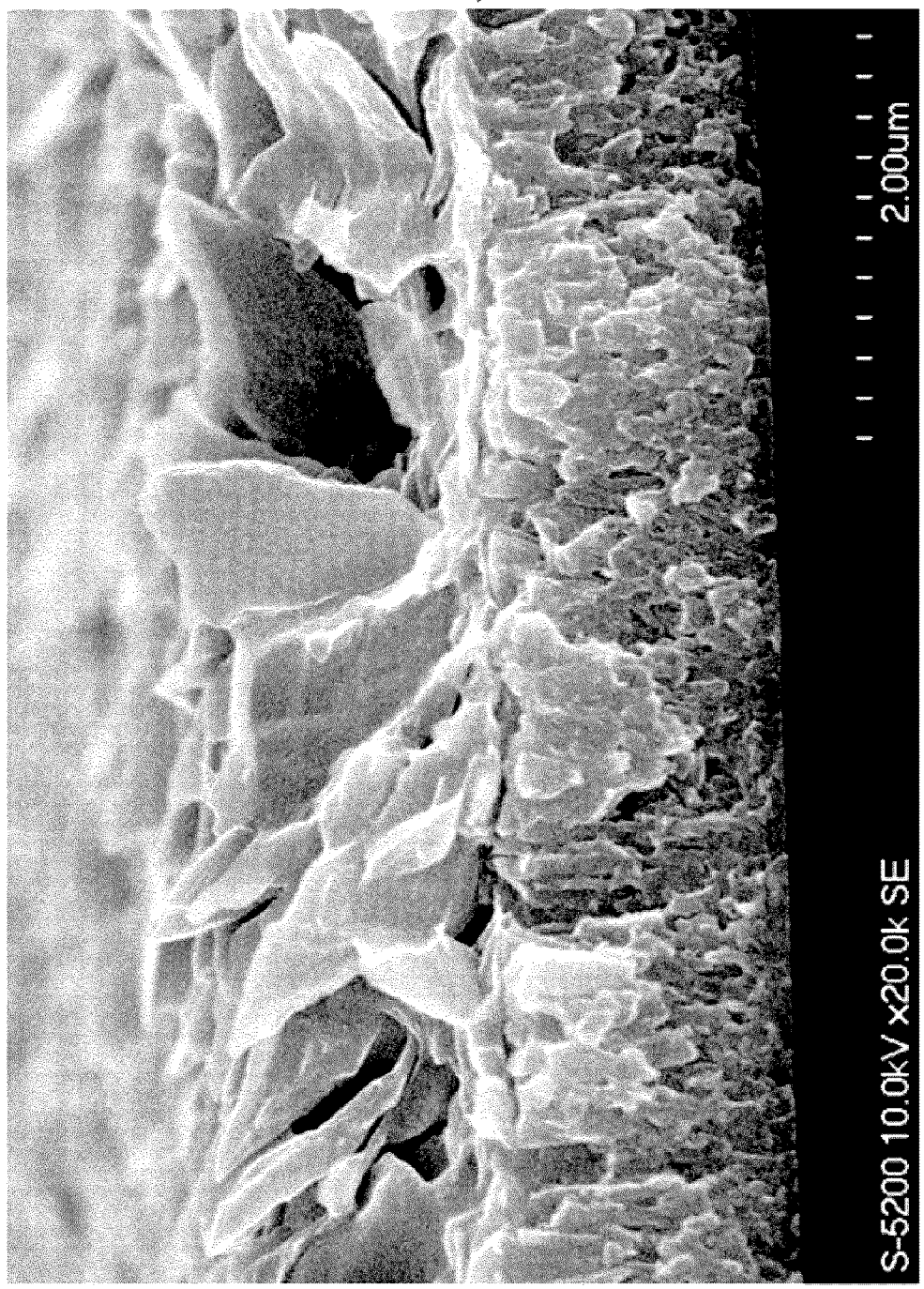
FIG. 21 is a micrograph obtained using a scanning electron microscope (SEM) for a sample of Example F.

The second sample was prepared by depositing the following layers or coatings, in the order indicated, on the surface of a silicon substrate: an approximately 1.4 μm thick coating of Mg:$C_{60}$, wherein the concentration of fullerene was gradually decreased from about 15 vol. % to 0 vol. % as the coating was formed; and an approximately 1.4 μm thick magnesium coating. SEM micrograph showing the cross-section of the second sample is provided in FIG. 21.

Figure 22:
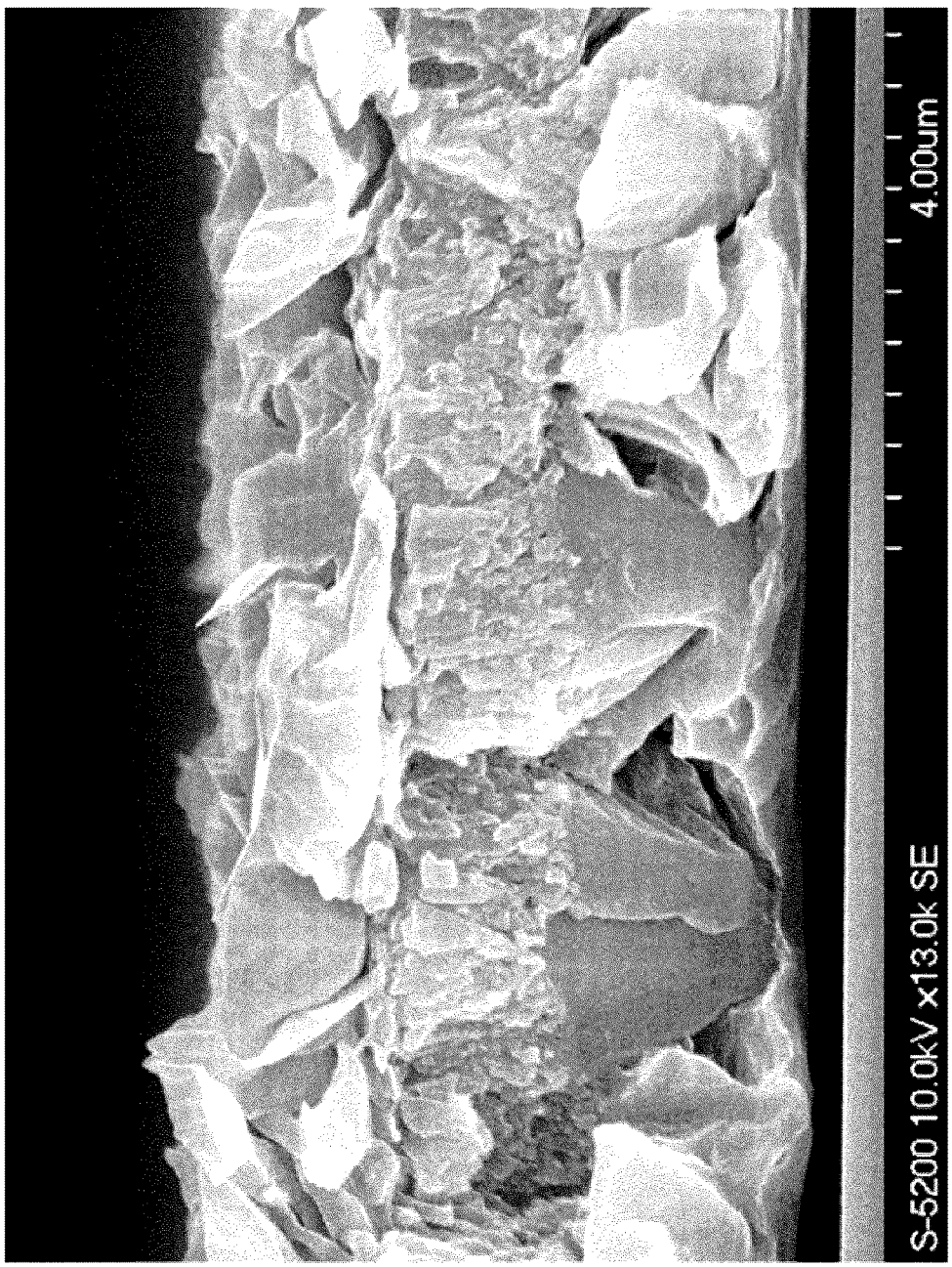
FIG. 22 is a SEM micrograph of another sample of Example F.

The third sample was prepared by depositing the following layers or coatings, in the order indicated, on the surface of a silicon substrate: an approximately 2 μm thick magnesium coating; an approximately 1.6 μm thick coating of Mg:$C_{60}$, wherein the concentration of fullerene was gradually decreased from about 15 vol. % to 0 vol. % as the coating was formed; and an approximately 1.5 μm thick magnesium coating. SEM micrograph showing the cross-section of the third sample is provided in FIG. 22.

Figure 23:
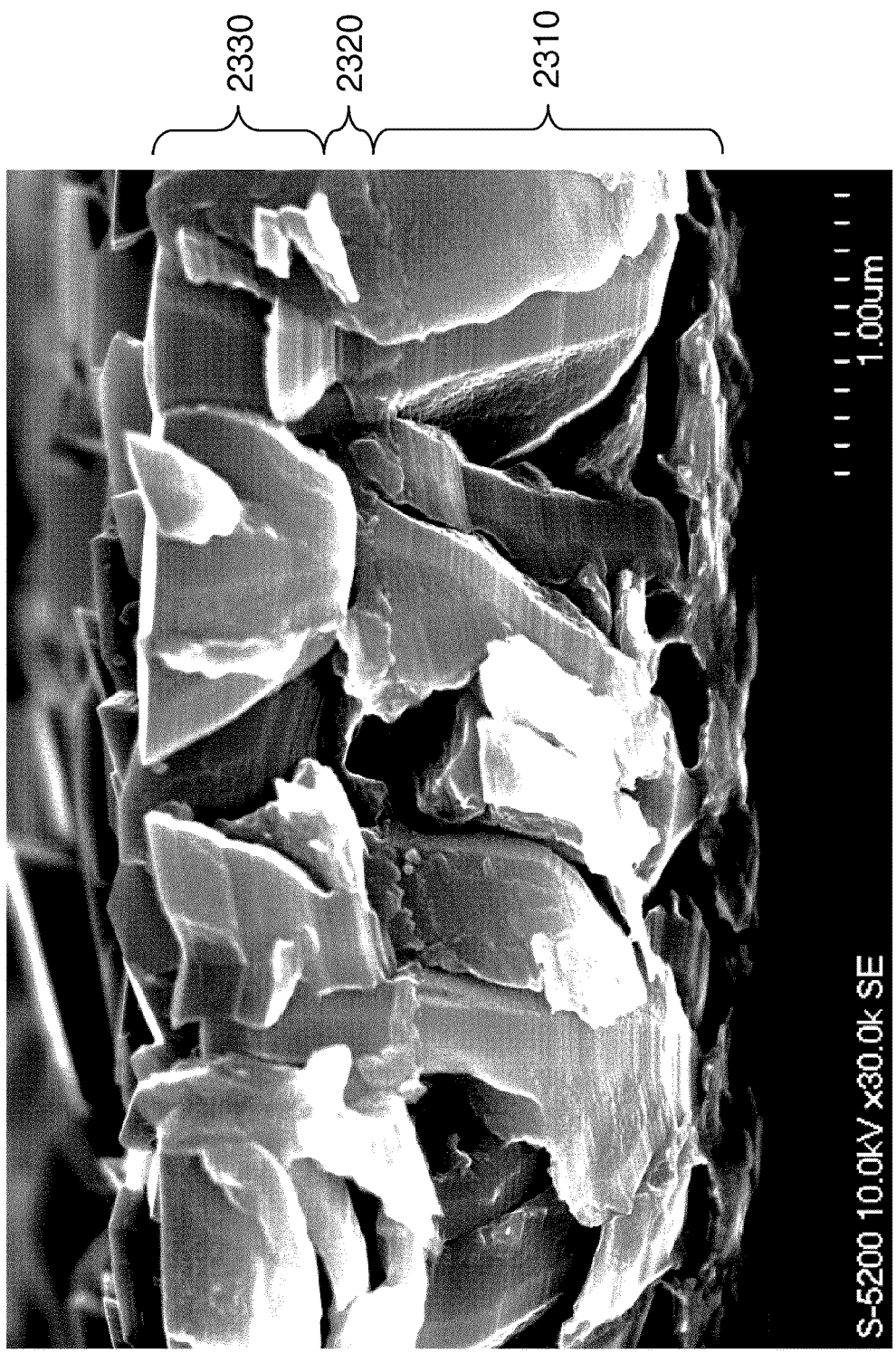
FIG. 23 is a SEM micrograph of yet another sample of Example F.

The fourth sample was prepared by depositing the following layers or coatings, in the order indicated, on the surface of a silicon substrate: an approximately 1 μm thick magnesium coating; an approximately 10 nm thick coating of $C_{60}$; and an approximately 1 μm thick magnesium coating. SEM micrograph showing the cross-section of the fourth sample is provided in FIG. 23. In FIG. 23, the approximate region corresponding to the first 1 μm thick magnesium coating is indicated using the reference numeral 2310, the approximate region corresponding to the 10 nm thick $C_{60}$ coating is indicated using the reference numeral 2320, and the approximate region corresponding to the second 1 μm thick magnesium coating is indicated using the reference numeral 2330. As can be seen from FIG. 23, the microstructure or growth mode of magnesium is disrupted at the interface between the first magnesium coating and the second magnesium coating due to the presence of the $C_{60}$ coating at the interface. Specifically, it can be observed that the microstructure or the grain structure of the first magnesium coating does not extend to the second magnesium coating, which is disposed on top of the first magnesium coating.

Figure 24:
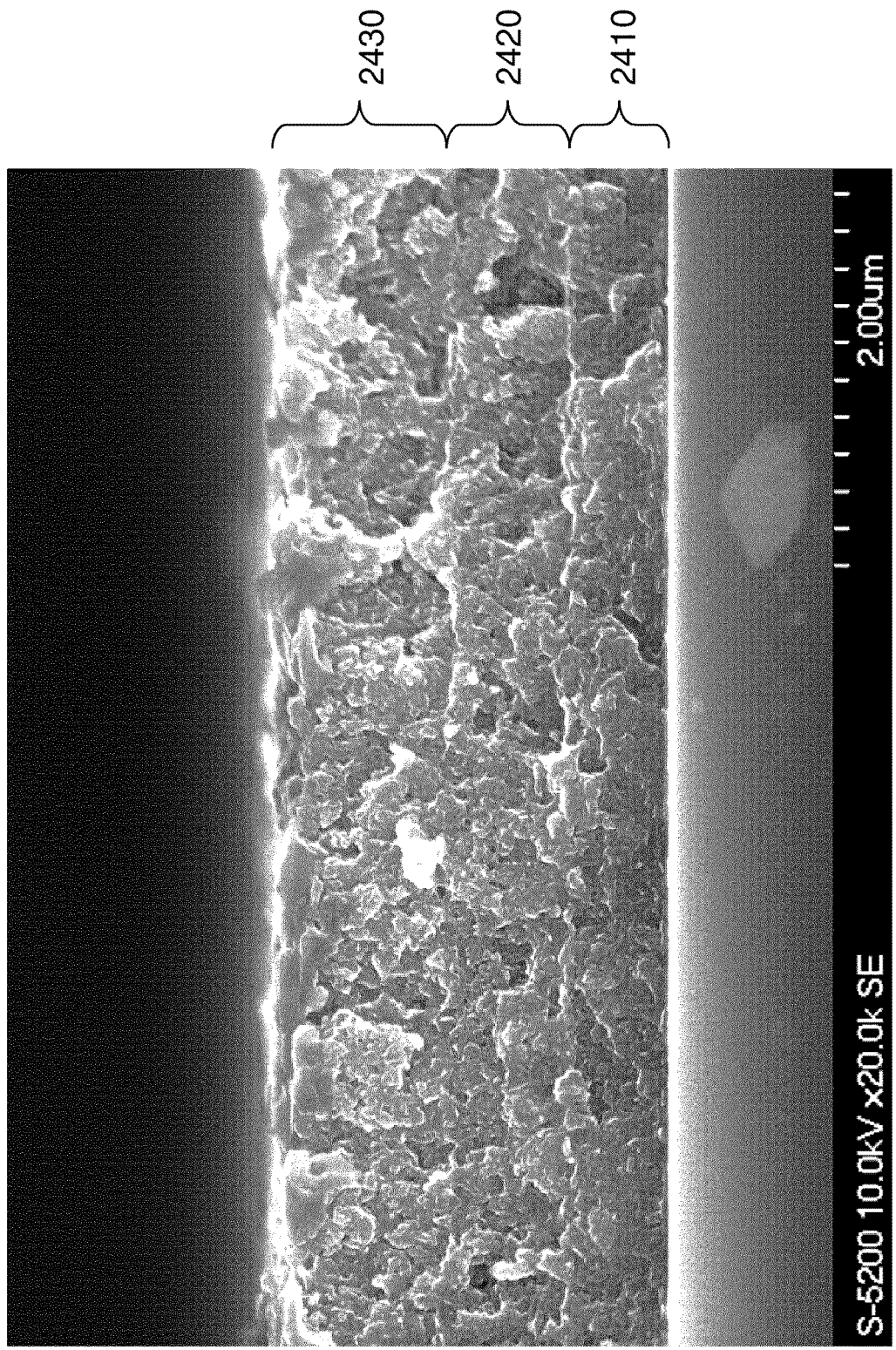
FIG. 24 is a SEM micrograph of yet another sample of Example F.

The fifth sample was prepared by depositing three sets of coatings on a silicon substrate one after another, each set of coating including an approximately 500 nm thick Mg:$C_{60}$ coating, followed by an approximately 100 nm thick magnesium coating. The $C_{60}$ concentration in each of the Mg:$C_{60}$ coating was gradually decreased from about 10% to 0% as the Mg:$C_{60}$ coating was formed. SEM micrograph showing the cross-section of the fifth sample is provided in FIG. 24. In FIG. 24, the approximate region corresponding to the first set of coating is indicated using the reference numeral 2410, the approximate region corresponding to the second set of coating is indicated using the reference numeral 2420, and the approximate region corresponding to the third set of coating is indicated using the reference numeral 2430.

Figure 25:
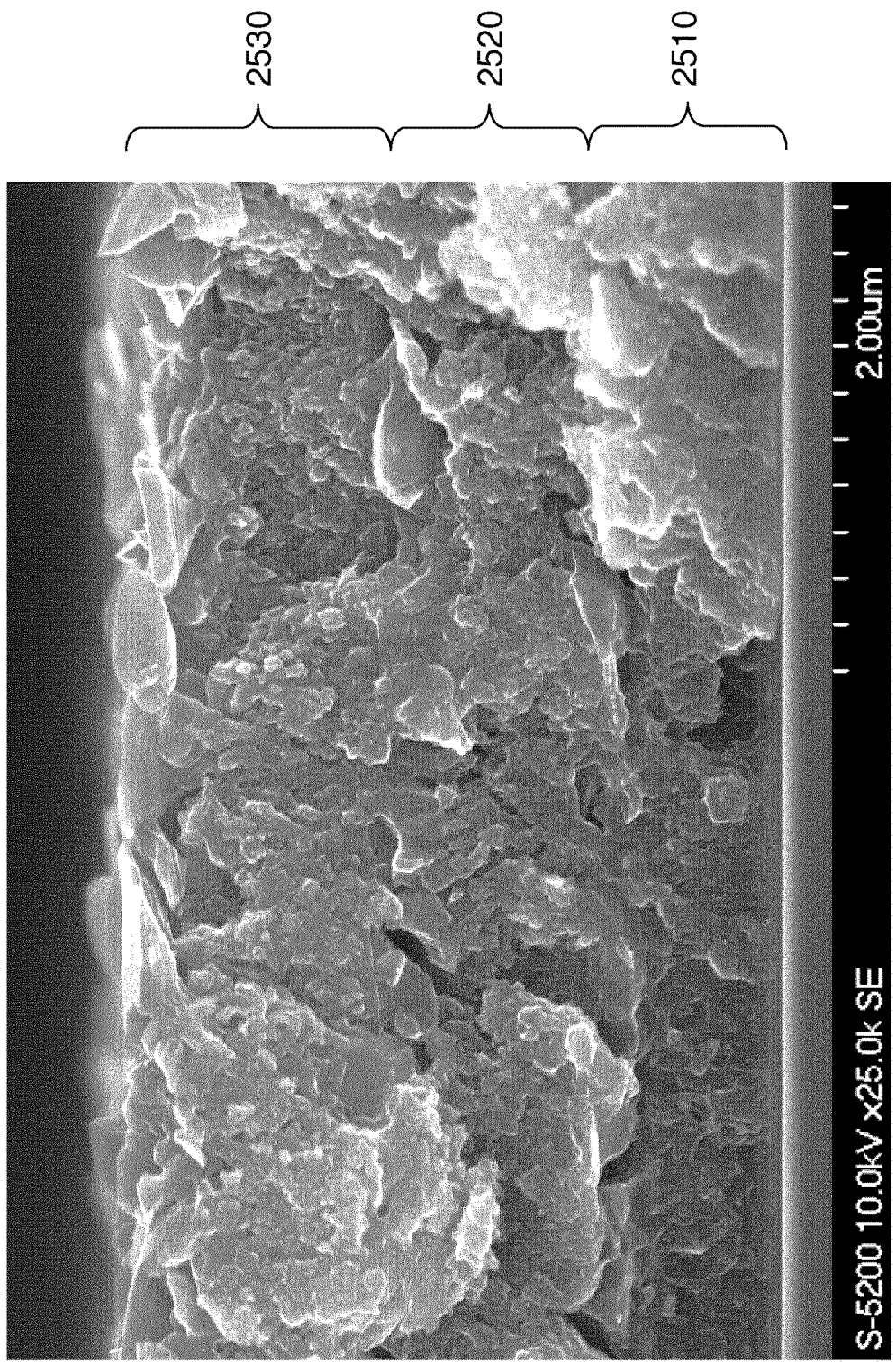
FIG. 25 is a SEM micrograph of yet another sample of Example F.

The sixth sample was prepared by depositing three sets of coatings on a silicon substrate one after another, each set of coating including an approximately 500 nm thick Mg:$C_{60}$ coating, followed by an approximately 300 nm thick magnesium coating. The $C_{60}$ concentration in each of the Mg:$C_{60}$ coating was gradually decreased from about 10% to 0% as the Mg:$C_{60}$ coating was formed. SEM micrograph showing the cross-section of the fifth sample is provided in FIG. 25. In FIG. 25, the approximate region corresponding to the first set of coating is indicated using the reference numeral 2510, the approximate region corresponding to the second set of coating is indicated using the reference numeral 2520, and the approximate region corresponding to the third set of coating is indicated using the reference numeral 2530.

Based on the analysis of the fifth and sixth sample, it was determined that, by providing fullerene-containing portions, the average compactness of the entire coating is increased in comparison to a substantially pure magnesium coating of similar thickness. Furthermore, the average grain size of substantially pure magnesium coatings deposited between neighboring Mg:$C_{60}$ coatings was determined to be lower than the average grain size of substantially pure magnesium coating deposited without the presence of adjacent Mg:$C_{60}$ coatings.

Based on the analysis of the above samples, the average grain size in various coatings were determined and these are summarized in the table below.

| Composition | Average Grain Size |
|---|---|
| Mg (without adjacent Mg:$C_{60}$ coatings) | ~0.98 μm |
| Mg (with adjacent Mg:$C_{60}$ coatings) | <0.3 μm |
| Mg:$C_{60}$ (15 vol. % $C_{60}$) | <0.3 μm |

-continued

| Composition | Average Grain Size |
|---|---|
| Mg:C$_{60}$ (linear decrease: 15 to 0 vol. % C$_{60}$) | <0.3 μm |
| Mg:C$_{60}$ (linear decrease: 10 to 0 vol. % C$_{60}$) | <0.2 μm |

Example G

X-ray diffraction (XRD) was used to conduct an analysis of the average grain size in magnesium-based coatings and the effect that the presence of fullerene have on the average grain size in such coatings. Based on the results of the analysis, the average grain size or crystallite size in a Mg:C$_{60}$ coating comprising 10 vol. % C$_{60}$ was determined to be approximately 29 nm, and the average grain size or crystallite size in a coating comprising 99.9% pure magnesium was determined to be greater than the detection limit of the XRD, which is about 60 nm.

Example H

Two samples were prepared to determine the effect of fullerene on the average density of the resulting coating.

The first sample was prepared by depositing a coating of substantially pure magnesium on the surface of a silicon substrate.

The second sample was prepared by depositing a coating containing a mixture of magnesium and C$_{60}$ on the surface of a silicon substrate. The average concentration of C$_{60}$ in the coating was approximately 10 vol. %.

The deposition process during the preparation of samples were monitored using a quartz crystal microbalance (QCM) to ensure that the total mass of the material deposited on the silicon surface for both the first sample and the second sample were substantially identical.

The thicknesses of the coatings formed in the first sample and the second sample were then measured using a profilometer. The results of the thickness measurements are summarized in the table below.

| Coating Composition | Coating Thickness |
|---|---|
| Magnesium | 1.95 μm |
| Mg:C$_{60}$ (10 vol. % C$_{60}$) | 1.58 μm |

Based on the above, the Mg:C$_{60}$ coating is thinner, and thus exhibits a higher average density compared to the magnesium coating. Specifically, it was determined that the density of the coating formed by a mixture of magnesium and C$_{60}$ (10 vol. % C$_{60}$) possesses an average density that is approximately 1.2 times greater than the average density of the magnesium coating.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the invention has been described with reference to certain specific embodiments, various modifications thereof will be apparent to those skilled in the art. Any examples provided herein are included solely for the purpose of illustrating the invention and are not intended to limit the invention in any way. Any drawings provided herein are solely for the purpose of illustrating various aspects of the invention and are not intended to be drawn to scale or to limit the invention in any way. The scope of the claims appended hereto should not be limited by the preferred embodiments set forth in the above description, but should be given the broadest interpretation consistent with the present specification as a whole. The disclosures of all prior art recited herein are incorporated herein by reference in their entirety.

The invention claimed is:

1. An opto-electronic device comprising:
   a first electrode;
   a second electrode;
   an organic layer disposed between the first electrode and the second electrode; and
   a barrier coating disposed over the second electrode, the barrier coating comprising:
   two or more first portions arranged in layers, each of the first portions comprising fullerene; and
   one or more second portions, wherein the second portions are arranged in layers alternating with the two or more first portions, the second portion comprising a metal.

2. The opto-electronic device of claim 1, wherein each of the first portions further comprise a metal.

3. The opto-electronic device of claim 2, wherein the average density of each of the first portions is greater than the average density of the second portion.

4. The opto-electronic device of claim 2 wherein the compactness of each of the first portions is greater than the compactness of each of the second portions.

5. The opto-electronic device of claim 2, wherein the average grain size of each of the first portions is less than the average grain size of the second portion.

6. The opto-electronic device of claim 2, wherein each of the first portions comprises about 5 to 20 percent fullerene by volume.

7. The opto-electronic device of claim 6, wherein the remainder of each of the first portion comprises the metal.

8. The opto-electronic device of claim 2, wherein the second portion further comprises fullerene, and wherein the concentration of fullerene in each of the first portions is greater than the concentration of fullerene in the second portion.

9. The opto-electronic device of claim 1, wherein the plurality of first portions and the second portion of the barrier coating are formed integrally with one another.

10. The opto-electronic device of claim 1, wherein the metal is selected from a group consisting of magnesium, cadmium, zinc, and any combination thereof.

11. The opto-electronic device of claim 1, wherein the barrier coating is electrically conductive.

12. The opto-electronic device of claim 11, wherein the barrier coating forms a part of the cathode.

13. The opto-electronic device of claim 12, wherein the organic layer further comprises a hole injection layer, a hole transport layer, a hole blocking layer, an electron blocking layer, an electron transport layer, an electron injection layer, or any combination thereof.

14. The opto-electronic device of claim 1, wherein first electrode is an anode and the second electrode is a cathode of the opto-electronic device.

15. The opto-electronic device of claim 1, wherein the organic layer comprises an electroluminescent layer.

16. The opto-electronic device of claim 1, further comprising a substrate, and wherein the first electrode is arranged proximal to the substrate and the second electrode is arranged distal to the substrate.

17. The opto-electronic device of claim 16, wherein the substrate comprises a plurality of thin film transistors.

18. The opto-electronic device of claim 1, wherein the fullerene comprises at least one of C60, C70, C76, C84, single-wall carbon nanotubes, and multi-wall carbon nanotubes.

* * * * *